United States Patent
Fleissner et al.

(10) Patent No.: US 9,685,638 B2
(45) Date of Patent: Jun. 20, 2017

(54) METHOD FOR PRODUCING A COMPONENT

(71) Applicant: OSRAM OLED GmbH, Regensburg (DE)

(72) Inventors: Arne Fleissner, Regensburg (DE); Carola Diez, Regensburg (DE); Nina Riegel, Tegernheim (DE); Thomas Wehlus, Lappersdorf (DE); Daniel Riedel, Regensburg (DE); Johannes Rosenberger, Regensburg (DE); Silke Scharner, Regensburg (DE)

(73) Assignee: ORAM OLED GmbH, Regensburg (DE)

( * ) Notice: Subject to any disclaimer, the term of this patent is extended or adjusted under 35 U.S.C. 154(b) by 0 days.

(21) Appl. No.: 14/917,297

(22) PCT Filed: Sep. 2, 2014

(86) PCT No.: PCT/EP2014/068626
§ 371 (c)(1),
(2) Date: Mar. 8, 2016

(87) PCT Pub. No.: WO2015/036287
PCT Pub. Date: Mar. 19, 2015

(65) Prior Publication Data
US 2016/0218326 A1    Jul. 28, 2016

(30) Foreign Application Priority Data
Sep. 12, 2013  (DE) .................. 10 2013 110 037

(51) Int. Cl.
*H01L 51/56*  (2006.01)
*H01L 51/00*  (2006.01)
(Continued)

(52) U.S. Cl.
CPC ............ *H01L 51/56* (2013.01); *C23C 14/042* (2013.01); *H01L 51/0011* (2013.01); *H01L 27/3239* (2013.01); *H01L 2251/5361* (2013.01)

(58) Field of Classification Search
CPC ....................................................... H01L 51/56
See application file for complete search history.

(56) References Cited

U.S. PATENT DOCUMENTS 6,074,697 A  *  6/2000  Ikemoto ................ H01P 11/007
                                                        427/123
8,877,532 B2 * 11/2014  Hiroki .................. H01L 51/0014
                                                        257/13
(Continued)

FOREIGN PATENT DOCUMENTS

DE         60217489 T2    10/2007
DE       112009000595 T5   2/2011
(Continued)

OTHER PUBLICATIONS

International Search Report based on appliaction No. PCT/EP2014/068626 (6 pages) dated May 12, 2015.
(Continued)

*Primary Examiner* — Evren Seven
*Assistant Examiner* — S. M. S Imtiaz
(74) *Attorney, Agent, or Firm* — Viering, Jentschura & Partner mbB

(57) ABSTRACT

Various embodiments may relate to a method for producing an optoelectronic component, including forming a first electrode on a substrate, arranging a first mask structure on or above the substrate, wherein the first mask structure comprises a first structuring region including an opening and/or a region prepared for forming an opening, arranging a second mask structure on or above the first mask structure, forming a second structuring region in the first mask structure and in the second mask structure in such a way that at
(Continued)

least one part of the first structuring region in the first mask structure is formed outside the second structuring region in the first mask structure.

10 Claims, 15 Drawing Sheets

(51) Int. Cl.
*C23C 14/04* (2006.01)
*H01L 27/32* (2006.01)

(56) References Cited

U.S. PATENT DOCUMENTS

| | | | | |
|---|---|---|---|---|
| 2002/0021089 | A1* | 2/2002 | Kim | H01L 27/3283 |
| | | | | 313/506 |
| 2003/0230816 | A1* | 12/2003 | Kappe | B42D 25/00 |
| | | | | 257/629 |
| 2004/0091741 | A1* | 5/2004 | Lin | H05B 33/04 |
| | | | | 428/690 |
| 2009/0104785 | A1* | 4/2009 | Cok | H01L 27/3211 |
| | | | | 438/759 |
| 2011/0215714 | A1* | 9/2011 | Seo | C09K 11/06 |
| | | | | 313/504 |
| 2012/0080667 | A1* | 4/2012 | Nowatari | C09K 11/06 |
| | | | | 257/40 |
| 2014/0077188 | A1* | 3/2014 | Aonuma | C23C 14/086 |
| | | | | 257/40 |
| 2014/0084256 | A1* | 3/2014 | Kim | H01L 51/504 |
| | | | | 257/40 |
| 2014/0235013 | A1* | 8/2014 | Heitzmann | H01L 51/0002 |
| | | | | 438/99 |

FOREIGN PATENT DOCUMENTS

| | | |
|---|---|---|
| WO | 9954786 A1 | 10/1999 |
| WO | 03001598 A1 | 1/2003 |
| WO | 2008035094 A1 | 3/2008 |
| WO | 2008038588 A1 | 4/2008 |
| WO | 2009112569 A1 | 9/2009 |
| WO | 2013045775 A1 | 4/2013 |

OTHER PUBLICATIONS

German Search Report based on application No. 10 2013 110 037.6 (7 pages) dated Aug. 22, 2014.

* cited by examiner

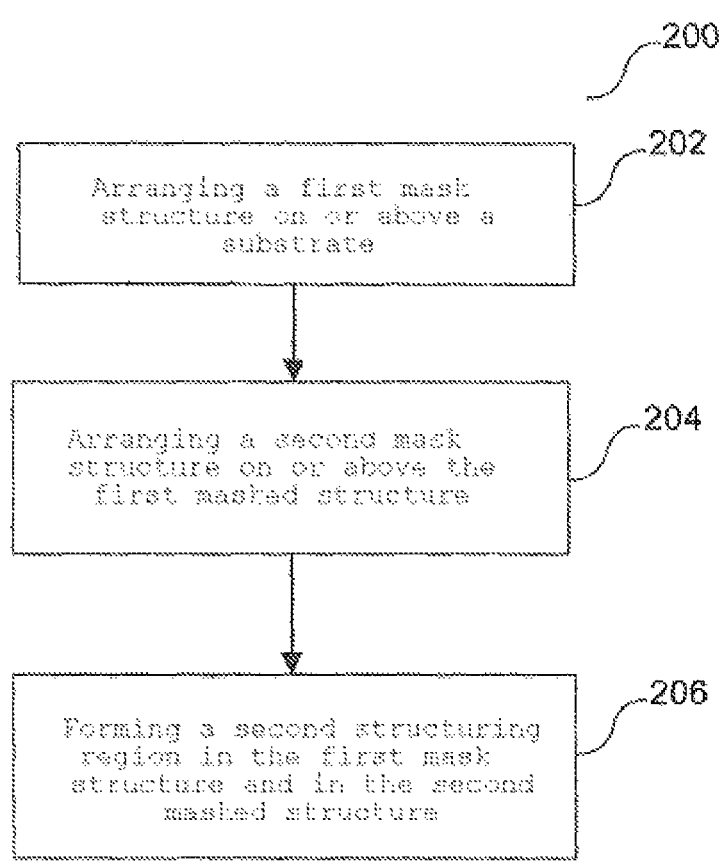

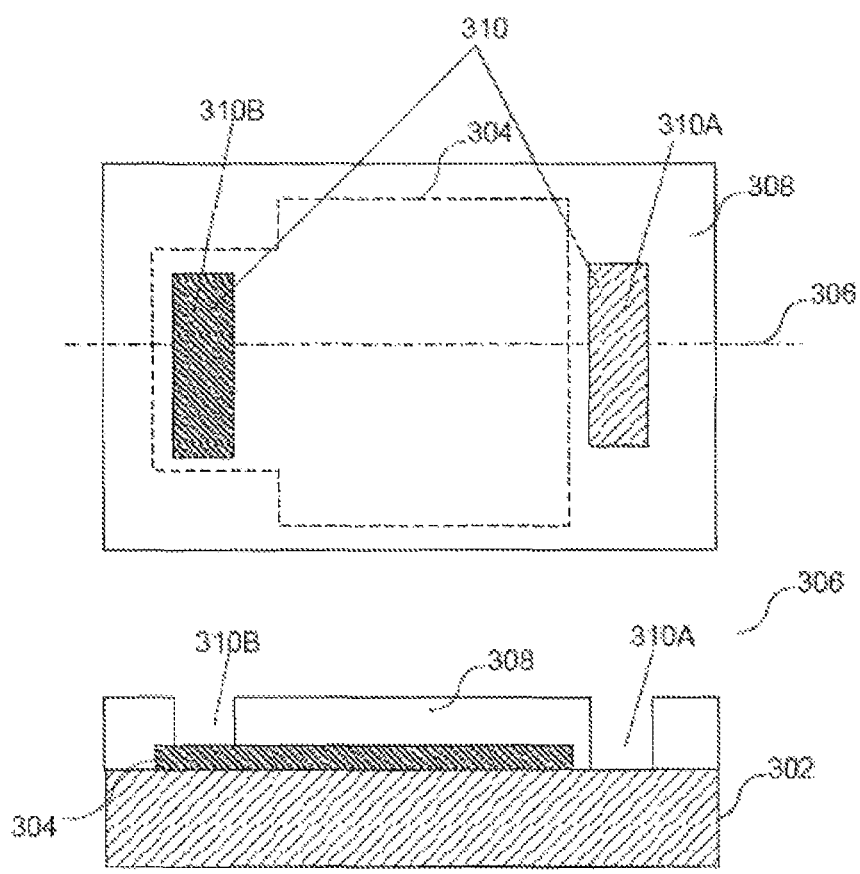

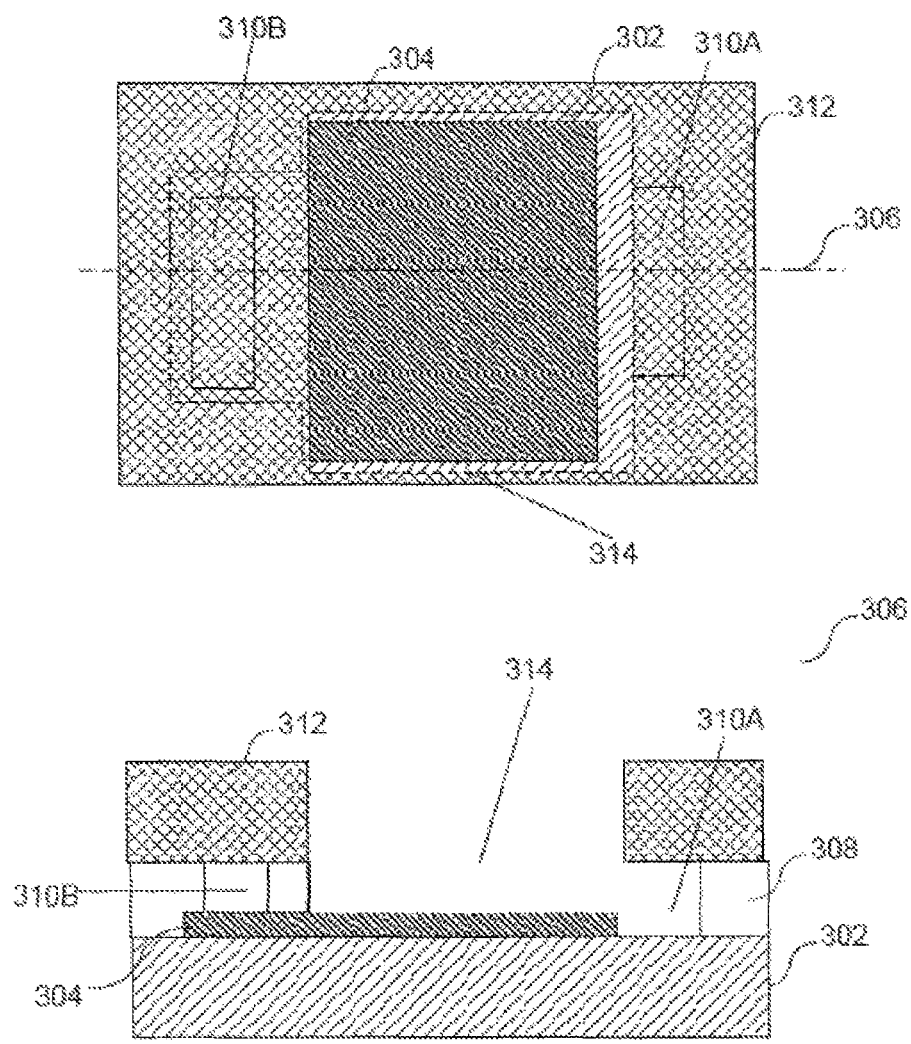

FIG 3F
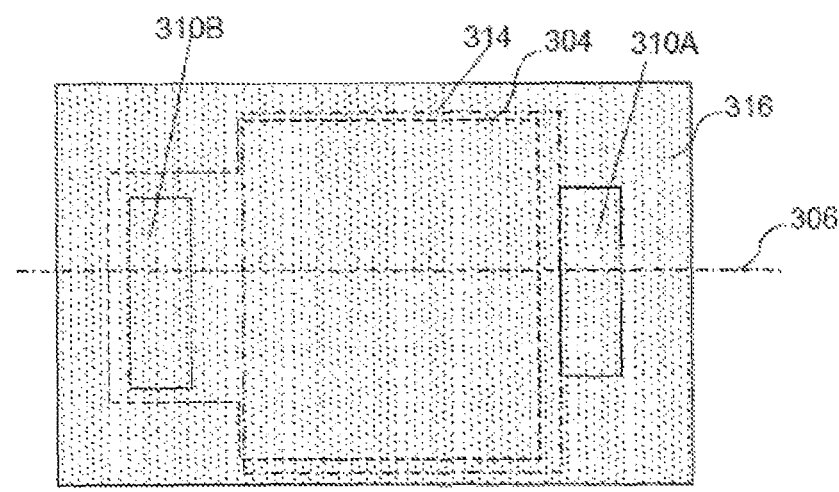
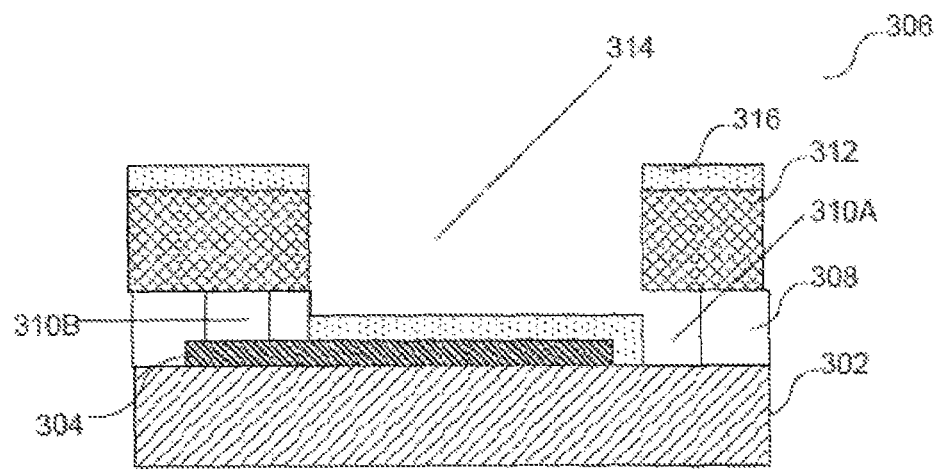

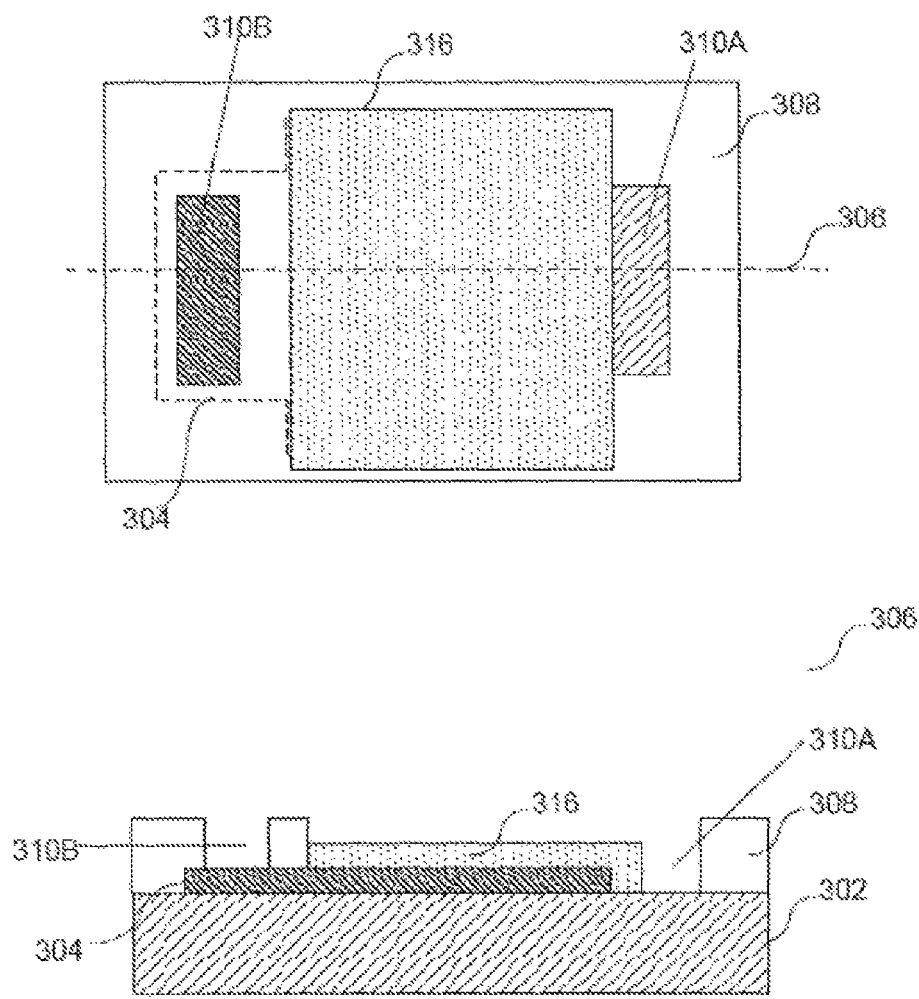

METHOD FOR PRODUCING A COMPONENT

RELATED APPLICATIONS

The present application is a national stage entry according to 35 U.S.C. §371 of PCT application No.: PCT/EP2014/068626 filed on Sep. 2, 2014 which claims priority from German application No.: 10 2013 110 037.6 filed on Sep. 12, 2013, and is incorporated herein by reference in its entirety.

TECHNICAL FIELD

In various embodiments, a method for producing a component is provided.

BACKGROUND

Optoelectronic components on an organic basis, for example organic light emitting diodes (OLED), are being increasingly widely used in general lighting, for example as a surface light source. An organic optoelectronic component, for example an OLED, may include an anode and a cathode with an organic functional layer system therebetween. The anode or the cathode is conventionally formed from a metal. The organic functional layer system may include one or a plurality of emitter layer(s) in which electromagnetic radiation is generated, one or a plurality of charge generating layer structure(s) each composed of two or more charge generating layers (CGL) for charge generation, and one or a plurality of electron blocking layer(s), also designated as hole transport layer(s) (HTL), and one or a plurality of hole blocking layer(s), also designated as electron transport layer(s) (ETL), in order to direct the current flow.

Individual layers of an OLED can conventionally be formed by different methods, for example by vapor deposition or wet-chemical methods.

During the production of an optoelectronic component, individual layers of the optoelectronic component are conventionally formed, for example deposited, successively above a substrate. The layers can be structured laterally during the deposition or afterward. Layers are structured laterally in order, for example in a functional thin-film system, to apply different layers of the functional thin-film system to in part different lateral regions of the substrate.

In the case of lateral structuring of a plurality of stacked thin functional layers during their deposition onto a substrate, the lateral structuring methods of the plurality of layers can mutually disturb one another. By way of example, the lateral structuring of the organic functional layer structure and the structuring of the metallic top electrode of an OLED during a physical vapor deposition of these layers can mutually disturb one another. During the production of a conventional OLED, it is necessary to apply the organic functional layer structure and the cathode in conjunction with partial overlapping in laterally different, defined regions on the substrate. For this purpose, during an inherently unstructured physical vapor deposition, the substrate is masked, i.e. "shaded", such that the deposited materials are deposited on the substrate only in the regions provided by the regions of the mask that allow passage. Particularly when producing OLEDs, metallic shadow masks are conventionally used for structuring layers during the physical vapor deposition. The metallic shadow masks 104 are arranged closely in front of the substrate 102 to be coated (illustrated in FIG. 1A). The shadow mask 104 has an opening, through which a coating 106 is applied to the substrate 102. Illustratively, the shadow mask 104 in the region without an opening shades the substrate 102 against a coating application during the process of forming the coating 106. In conventional methods, the shadow mask 104 is arranged above the substrate 102, such that the shadow mask 104 and the substrate 102 have no physical contact. As a result, it happens that during the process of coating the substrate 102 in the penumbra at the edges of the opening of the shadow mask 104 on the substrate 102 in the actually shaded region of the substrate 102 a coating 106 is formed (identified by the encircled area bearing the reference sign 108). The production and use of metallic shadow masks is a relatively cost-intensive process. The production of metallic shadow masks can prove to be complex, for example laser cutting and/or wet-chemical production including photoresist coating, photolithographic patterning and subsequent etching. Furthermore, the metallic shadow masks can be coated during the physical vapor deposition. Therefore, conventionally these "coats" are often cleaned from the metallic shadow masks and the latter are regularly replaced. In order to be able to perform a plurality of coating steps in which different regions are coated, the metallic masks are changed during the coating process. Changing the metallic masks is associated with a considerable time expenditure, which has unfavorable effects on the cycle time of the production of the component. Furthermore, conventional metallic masks have a disadvantage resulting from their use with regard to the lateral structuring. By way of example, without very complex multi-mask processes it is not possible to realize "free-standing" uncoated regions within a coated area. In the case of an OLED, therefore, with a simple metal mask process, it is neither possible to produce independent luminous regions within another luminous region, nor possible to produce open non-luminous regions within a luminous region.

Furthermore, regions not to be coated between coated regions have a minimum distance of a few millimeters. Otherwise the thin webs of the metallic mask would not have the necessary stability and might sag. Therefore, it is not possible, with a simple, conventional shadow mask process, to form individual luminous regions alongside one another on a substrate, without accepting large non-luminous dead regions.

In the field of microstructuring for microelectronic components, for example transistors, it is known to use film masks 110 (illustrated in FIG. 1B). In this case, a film is laminated onto a substrate 102 to be coated. Afterward, the film is microstructured, i.e. partly opened, for example by a laser ablation. Afterward, the film is coated over the whole area. The film is subsequently stripped away from the substrate. The applied material remains on the substrate 102 only in the regions of the film 110 that were opened beforehand by the microstructuring step. As a result, after removal of the film mask 110, a coating 106 having defined edges (illustrated by the encircled area bearing the reference sign 112), can be formed on the substrate 102. Two or more film masks lying one on top of another can conventionally be used, wherein film masks lying one on top of another conventionally are structured simultaneously and identically in the same microstructuring step. As a result, coating is carried out in the resultant free regions of the two films. After the process of stripping away only the upper film of the films lying one on top of another, the coated material remains in the exposed region and in this case is laterally enclosed by the lower film remaining on the substrate. Furthermore, conventional methods do not provide for defining different open regions in both film masks, i.e. the first mask film is not structured before the second mask structure is applied.

It is furthermore known to use film masks for the production of OLEDs or OLED displays. For this purpose, a masking film is applied to a substrate. The masking film is structured into a plurality of regions; into masking regions and regions for openings. A removal film is applied to the masking film and adhesively bonded to the masking film in the regions for openings. The removal film is stripped away with the adhesively bonded regions of the masking film, such that a mask film having open regions remains on the substrate. Afterward, the substrate is coated with material. After the first coating step, the mask film is stripped away, such that only material in the envisaged regions remains on the substrate. Alternatively, the first mask film initially remains on the substrate and the entire process is repeated with one or a plurality of further mask films. The resultant multiple stack of mask films is finally removed in its entirety after the last coating step in a single process. As a typical use example, provision is made for applying the organic emitter material of the three subpixels (red, green and blue) required per pixel for a display successively in different positions on the substrate.

It is furthermore known to use a film mask for structured coating of a substrate with a single layer in a roll-to-roll method. For this purpose, a prestructured mask film is continuously laminated onto a substrate film, the latter is coated, and the mask film is subsequently stripped away.

Furthermore, in conventional methods, microscopic free regions are directly structured into the mask structure on the substrate, e.g. by laser ablation. In the case of large-area optoelectronic components, the method duration can lengthen as a result.

Furthermore, in one conventional method, a second mask film is applied to the substrate and structured only after a first coating step has been carried out. In this case, therefore, applying and structuring the second film take place between the first and second coating steps.

Furthermore, in one conventional method, a mask film is removed from the substrate by adhesive bonding of a further film and subsequent lift-off of the further film with the mask film.

SUMMARY

In various embodiments, a method for producing a component is provided which makes it possible to apply the lateral structuring of a plurality of stacked functional thin layers during their deposition onto a substrate, for example in order to apply different layers to in part different lateral regions of the substrate in a functional thin-film system.

In various embodiments, a method for producing a component is provided, the method including: arranging a first mask structure on or above a substrate; arranging a second mask structure on or above the first mask structure, wherein the first mask structure includes a first structuring region before the second mask structure is applied to the first mask structure, wherein the first structuring region includes an opening and/or a region prepared for forming an opening; and forming a second structuring region in the first mask structure and in the second mask structure in such a way that at least one part of the first structuring region in the first mask structure is formed outside the second structuring region in the first mask structure.

Illustratively, the first structuring region can be formed at least partly alongside the first structuring region. Alternatively, the second structuring region can be formed completely within the dimensioning of the first structuring region, wherein the first structuring region is larger than the second structuring region.

In one configuration, at least one part of an optoelectronic component can be formed; wherein the optoelectronic component is formed with an optically active region for absorbing or emitting electromagnetic radiation. Furthermore, the optoelectronic component may include an optically inactive region alongside the optically active region.

In one configuration, the optoelectronic component may include a first electrode, a second electrode and an organic functional layer structure or be formed in this way, wherein the organic functional layer structure is formed between the first electrode and the second electrode.

In one configuration, the optoelectronic component can be formed as an organic light emitting diode, an organic solar cell and/or an organic photodetector.

In one configuration, the optoelectronic component can be formed as a surface component.

In one configuration, the first structuring region and/or the second structuring region can be formed in such a way that by the first structuring region and/or the second structuring region information is represented in the optically active region, for example a pictogram, an ideogram and/or lettering; a look through hole, a window, a see through opening.

In one configuration, the first mask structure and/or the second mask structure can be formed in a self-supporting fashion. A self-supporting structure can act as a mask for example without a carrier or a holder.

In one configuration, the first mask structure can be arranged on or above the substrate, for example in the form of a film, a plate or a sheet.

One mask structure which is arranged on the substrate or on another mask structure can have a physical contact therewith, for example by an adhesive connection. As a result, the distance between the mask structure and the substrate or the other mask structure can be reduced. As a result, it is possible to reduce the structuring region of the coating and/or the removal of the substrate and/or of the other mask structure in the region of the edges. Illustratively, the dimensions of the penumbra can be reduced as a result.

One mask structure which is arranged above the substrate or above another mask structure can have no physical contact therewith, for example by virtue of the mask structure being arranged in a holder above the substrate and/or the other mask structure. As a result, the mask structure above the substrate and/or above the other mask structure can be removed therefrom particularly simply, for example by virtue of the holder being moved away from the substrate.

In one configuration, the second mask structure can be arranged on or above the first mask structure, for example in the form of a film, a plate or a sheet.

In one configuration, the first mask structure may include an adhesive layer and can be connected to the substrate by the adhesive layer, for example as a self-adhesive film, a self-adhesive plate or a self-adhesive sheet.

In one configuration, the second mask structure may include an adhesive layer and can be connected to the first mask structure by the adhesive layer, for example as a self-adhesive film, a self-adhesive plate or a self-adhesive sheet.

In one configuration, the first mask structure can be formed as a coating on or above the substrate, for example in a manner removable in one piece, for example as a coating which is crosslinked in one piece. The coating can be cured and/or crosslinked after the solution, suspension or dispersion of the substance or substance mixture of the coating has been applied. Furthermore, the coating can be structured or can be formed in a structured fashion. Furthermore, the coating can be formed on the substrate, that is to say can have a physical contact. Alternatively, the coating can be formed above the substrate, for example on a carrier, for example a carrier film, for example in a frame; wherein the carrier is arranged on or above the substrate, i.e. in a non-self-supporting fashion.

In one configuration, the second mask structure can be formed as a coating on or above the first mask structure, for example in a manner removable in one piece, for example as a coating that is crosslinked in one piece, for example in accordance with a configuration of the first mask structure from a coating.

In one configuration, the first mask structure and/or the second mask structure may include or be formed from a polymer, for example as a plastics coating, a plastics film, a plastics sheet and/or a plastics plate.

In one configuration, arranging the first mask structure and/or arranging the second mask structure may include in each case arranging a plurality of mask structures alongside one another, for example a plurality of separated mask structures alongside one another. By way of example, different first mask structures can be arranged on or above the optically active region and on or above the optically inactive region, for example with a different hardness, chemical resistance with respect to a solvent and/or absorption of electromagnetic radiation or heat.

In one configuration, the first mask structure can be arranged in a physical contact on the substrate, for example by an adhesive connection.

In one configuration, the second mask structure can be arranged in a physical contact on the first mask structure, for example by an adhesive connection.

In one configuration, the first mask structure can be arranged in a holder above the substrate, for example in a frame.

In one configuration, the second mask structure can be arranged in a holder above the first mask structure, for example in a frame.

In one configuration, the first structuring region can be formed at least partly in the first mask structure before the first mask structure is arranged on or above the substrate.

In one configuration, the first structuring region can be formed at least partly in the first mask structure after the first mask structure is arranged on or above the substrate.

In one configuration, the first mask structure can be formed on or above the substrate in a structured fashion in the form of a coating in such a way that a first structuring region is formed after the coating has been cured and/or crosslinked.

In one configuration, the second structuring region can be formed at least partly in the first mask structure and/or the second mask structure before the second mask structure is arranged on or above the first mask structure.

In one configuration, the second structuring region can be formed at least partly in the first mask structure and/or the second mask structure after the second mask structure is arranged on or above the first mask structure.

In one configuration, the second mask structure can be formed on or above the first mask structure in a structured fashion in the form of a coating in such a way that the second structuring region is formed at least partly in the second mask structure after the coating has been cured and/or crosslinked.

In one configuration, forming the first structuring region and/or the second structuring region may include forming at least one of the following structurings in the first mask structure and/or the second mask structure: a hole, a predetermined separating location, a ring structure.

In one configuration, the first structuring region can be formed in such a way that it has a different adhesion with regard to the substrate, a different adhesion with regard to the second mask structure and/or a different cohesion than the first mask structure outside the first structuring region. By way of example, the first structuring region can have a lower adhesion with regard to the substrate and a higher adhesion with regard to the second masking structure than the first masking structure outside the first structuring region. As a result, the first structuring region can be removed with the second mask structure. By way of example, the first structuring region can have a higher adhesion with regard to the substrate and a lower adhesion with regard to the second masking structure than the first masking structure outside the first structuring region. As a result, the first structuring region can remain on the substrate when the first masking structure is removed from the substrate. Illustratively, the first structuring region remaining on the substrate thereby forms a positive mask. In the case where the first structuring region is removed and the masking structure remains outside the first structuring region on or above the substrate, illustratively a negative mask is formed.

In one configuration, the adhesion and/or cohesion of the first structuring region and/or of the second structuring region after the application of the first masking structure and/or the second masking structure can be altered, for example by an energy input, for example by an increase in temperature, a UV irradiation and/or a laser radiation; for example in a focused and/or pulsed fashion.

In one configuration, the second structuring region can be formed in such a way that the second structuring region has a different adhesion with regard to the first mask structure, a different adhesion with regard to a further mask structure on the second mask structure and/or a different cohesion than the second mask structure outside the second structuring region.

In one configuration, the first structuring region and/or the second structuring region can be formed in such a way that in each case at least one region which is separated and/or removable from the mask structure is formed.

In one configuration, the region separated in the first mask structure can be surrounded by the first mask structure after the second mask structure has been arranged on or above the first mask structure. Illustratively, a region separated from the masking structure in the structuring region can remain on the substrate.

In one configuration, the region separated in the first mask structure can be formed as a supporting structure of the second mask structure, for example in the case of large-area first structuring regions with regard to the stiffness of the second mask structure.

In one configuration, the first structuring region can be formed in such a way that the separated region in the first mask structure is removable areally in one piece.

In one configuration, the first structuring region can be formed in such a way that two or more identical or different first structurings are formed in the first mask structure, wherein the two or more first structurings in the first mask structure are arranged laterally alongside one another and/or wherein at least two of the first structurings partly overlap in the first mask structure, for example are separated from one another by a web.

In one configuration, the second structuring region can be formed in such a way that two or more identical or different second structurings are formed in the first mask structure and/or the second mask structure, wherein the two or more second structuring regions in the first mask structure and/or the second mask structure are arranged laterally alongside one another and/or one above another.

In one configuration, the first mask structure may include a position marking or such a position marking can be formed in the first mask structure in such a way that the second mask structure and/or the second structuring region are/is alignable on the basis of the position marking.

In one configuration, forming the region prepared for forming an opening may include at least one of the following methods: scribing, cutting or stamping in such a way that at least two respectively continuous regions isolated from one another are formed; forming a hole or cavity in such a way that a predetermined separating location is formed, such that a region is removable from the first mask structure in one piece, for example by mechanical stripping away or dry and/or wet-chemical etching; exposure using electromagnetic radiation that leads to crosslinking or degradation of the first mask structure in the exposed region, and/or reducing the adhesion of a region of the first mask structure.

In one configuration, the first mask structure can be formed in such a way that the first structuring region is removable jointly with the removal of the second structuring region.

In one configuration, the method can furthermore include as a result of the second structuring region: applying a substance or substance mixture to the substrate and/or removing a substance or substance mixture from the substrate. In other words, as a result of the second structuring region a substance or substance mixture can be applied to the substrate and/or a substance or substance mixture can be removed from the substrate, for example for the case where the second structuring region is formed as a negative mask. In one configuration, the second structuring region can be formed as a positive mask, such that by the second structuring region a substance or substance mixture can be applied to the substrate and/or a substance or substance mixture can be removed from the substrate.

In one configuration, the method can furthermore include as a result of the first structuring region: applying a substance or substance mixture to the substrate and/or removing a substance or substance mixture from the substrate. In other words, as a result of the first structuring region a substance or substance mixture can be applied to the substrate and/or a substance or substance mixture can be removed from the substrate, for example for the case where the first structuring region is formed as a negative mask.

In one configuration, the first structuring region can be formed as a positive mask, such that by the first structuring region a substance or substance mixture can be applied to the substrate and/or a substance or substance mixture can be removed from the substrate.

In one configuration, the first mask structure and/or the second mask structure may include a lug, wherein the lug is formed in such a way that the first mask structure and/or the second mask structure are/is removable by a tensile force on the lug.

In one configuration, the method can furthermore include: at least partly removing the second mask structure and arranging a third mask structure on or above the first mask structure, and forming a third structuring region, wherein the third structuring region can be different than the second structuring region.

In one configuration, the method can furthermore include: arranging a third mask structure on or above the second mask structure, and forming a third structuring region, wherein the third structuring region can be different than the second structuring region.

In other words: in one configuration, the method may include arranging a third mask structure, wherein the third mask structure is applied on or above the first mask structure after the second mask structure has been at least partly removed, and/or wherein the third mask structure is applied on or above the second mask structure.

In one configuration, the first mask structure and the second mask structure can be arranged as a mask stack on or above the substrate.

In one configuration, two or more mask structures can be arranged on or above the first mask structure.

In one configuration, the first mask structure and/or the second mask structure can be formed in a reusable fashion, for example as a film, sheet or plate.

In one configuration, at least one first mask structure can be arranged laterally alongside at least one further first mask structure on or above the substrate, and/or at least one second mask structure can be arranged laterally alongside at least one further second mask structure on or above the first mask structure or the first mask structures.

In one configuration, at least one of the plurality of first mask structures and/or second mask structures can differ from the other first mask structures and/or second mask structures in at least one property, for example in the transparency and/or absorption of electromagnetic radiation; the mechanical hardness and/or the chemical resistance.

In one configuration, the first structuring region can be formed in such a way that the first structuring region includes or forms at least one cavity in the first mask structure. A cavity can be a hole, for example.

In one configuration, the region separated in the mask structure can differ with respect to the mask structure in at least one of the following properties: the hardness, the adhesion with regard to the substrate and/or the other physically connected masking structure, for example may include a different adhesive; the chemical resistance with regard to a solvent; the cohesion, the absorption and/or transmission of electromagnetic radiation.

In one configuration, the first structuring region can be formed in such a way that in an optoelectronic component the optically active region is structurable independently of the optically inactive region, for example by virtue of there being arranged on or above the optically active region mask structures which have different physical properties with respect to the masking structure on or above the optically inactive region.

In one configuration, the first structuring region can be formed in such a way that an electrical connection region can be formed by the first structuring region. An electrical connection region may include one or a plurality of contact pad(s), for example.

In one configuration, the second mask structure may include a structuring region and/or a prepared region before the process of arranging on or above the first mask structure.

In one configuration, the structuring region and/or the prepared region of the second mask structure, before the process of arranging on or above the first mask structure, after the process of arranging the second mask structure, can be formed as second structuring region, as structure region of the second structuring region or as third structuring region.

In various embodiments, a method for producing an optoelectronic component is provided, the method including: forming the first electrode on the substrate; forming the organic functional layer structure above the first electrode and/or above the substrate; and forming the second electrode above the organic functional layer structure and/or above the substrate. The mask structure having the structuring region is formed as a coating above the substrate and is cured and/or crosslinked. The organic functional layer structure is formed in the structuring region. The mask structure is removed. The mask structure can be the first or second mask structure. The coating is applied in a liquid state above the substrate and is subsequently, that is to say above the substrate, hardened and/or dried, as a result of which the corresponding mask structure is formed. Consequently, the material for the first and/or the second mask structure can be applied in a liquid state above the substrate. The mask structure can be formed by a printing method, for example by screen printing or inkjet printing. Optionally, the coating can be applied in a finished structured fashion and thus already include the corresponding structuring region during the application process.

Furthermore, only a single mask structure can be applied, for example only the first mask structure or only the second mask structure. Furthermore, only the material of one of the mask structures can be applied in a liquid state, for example only that of the first mask structure or only that of the second mask structure, and the material of the other mask structure can be applied in a conventional method. The mask structure can be removed before or after the process of forming the second electrode. The mask structure can be removed mechanically.

Forming one or both mask structures as a coating and, in association therewith, applying the material of the mask structures in a liquid state make it possible that film-mask-related process steps to be employed otherwise can be avoided. In particular, cutting, laminating and/or adhesive bonding of the corresponding film mask can be dispensed with. The use of the coatings as a mask, that is to say the use of printed film masks, instead of the conventional metallic shadow masks affords a cost saving since the comparatively expensive metallic masks and the regular cleaning thereof are obviated. Moreover, new component designs that demand the deposition of materials into different regions than hitherto can be implemented more rapidly since it is not necessary firstly to produce a new metal shadow mask, rather the new shapes can be printed simply in the form of the coating. Since the coating, in particular the coated film mask, is situated directly on the substrate, the first electrode or the first mask structure, the lateral definition of the coated regions is better, in particular more precise, than in the case of a metallic shadow mask, which in principle is brought in front of the substrate at a small distance. In particular, this eliminates possible fault sources such as sagging or flexure (e.g. also on account of thermal warpage during the coating) of the metallic mask or of the substrate, which can occur in conventional methods and can lead to a lateral widening of the coated region as a result of the increased distance between substrate and mask.

Even in the fault-free conventional process using metallic shadow masks, a gentle tapering of the coated region, i.e. a thickness gradient of the deposited layer at the edge thereof, occurs in principle as a result of the shadow casting. In contrast thereto, the coating with the use of the printed film mask has a sharp edge since the adjoining regions of the substrate were covered by the mask film in direct contact during the coating process, such that no vapor admission from underneath is possible.

Furthermore, the use of printed film masks makes it possible in a simple manner to produce individual pixels that lie closely alongside one another, without the intervening non-luminous regions being expanded to a number of millimeters, as is necessary in the case of metallic shadow masks. A further advantage of film masks is their flexibility, as a result of which they can be used even on surfaces that are not planar. In particular, the method enables the structured coating of bent or differently shaped surfaces or of 3D bodies. For this purpose, the printed film masks can be applied to an initially planar, flexible substrate and then be brought to shape jointly with the latter, or can be applied directly to a substrate that has already been shaped.

When a plurality of conventional shadow masks are used, they have to be changed between the coating steps, their accurate positioning usually being carried out mechanically, which entails inaccuracies of hundreds of micrometers in the lateral position of the various material layers. Therefore, in conventional methods there are regularly strict design rules that take account of said inaccuracies, in particular with regard to the positioning of contact areas in relation to active luminous areas or with regard to the position of all the deposited layers on the substrate. As a result, the maximum active luminous area of the OLED decreases by these tolerances of the mask positioning. This is different when printed film masks are used as mask structures, since layers from printing processes can be regularly positioned with accuracies of a few 10 µm by optical alignment. This allows less strict design rules and enlarges the area maximally usable as luminous area on the substrate, which is associated with a cost saving as a result of better material utilization.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 2 shows schematic illustrations concerning a method in accordance with various embodiments;

FIGS. 3A-3I show schematic illustrations of a component in the method in accordance with various embodiments;

DETAILED DESCRIPTION

Figure 1A:
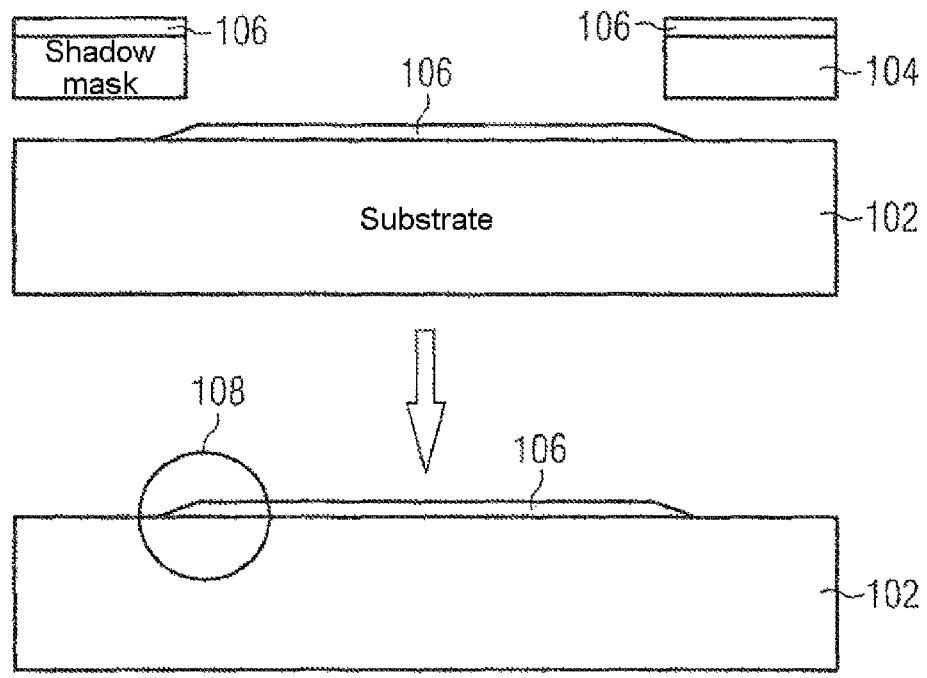
FIGS. 1A, 1B show schematic cross-sectional views of a substrate in conventional methods.
Figure 1B:
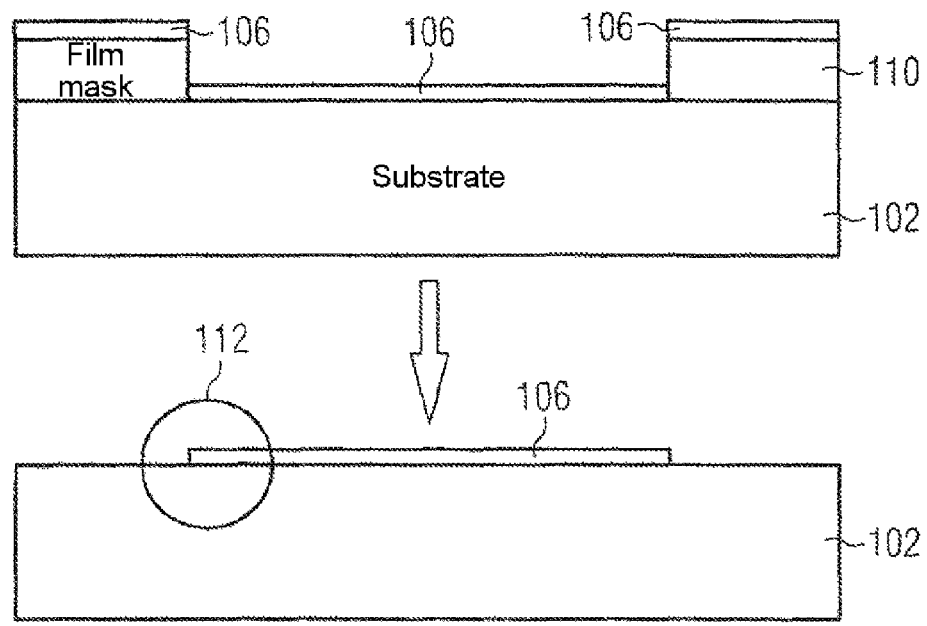

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

In the description, the method is explained on the basis of the example of a first mask structure and a second mask structure on or above a substrate, for the sake of simplicity. A mask structure is a planar structure including openings for applying and/or removing a substance or substance mixture on/from a substrate that is exposed within the opening. However, it is also possible to use more than two mask structures lying one on top of another, and accordingly to carry out in each case more than two structuring and processing steps. Processing can be applying and/or removing a substance and/or a substance mixture to/from the substrate. The first mask structure may include one feature or a plurality of features of one configuration or a plurality of configurations of the second mask structure, and vice versa.

In various embodiments, a substrate can be a carrier, a mechanical component, an electronic component, for example an optoelectronic component, a thermoelectric component and/or an integrated circuit, or can be formed as such. In other words: the substrate can be an intermediate product of one of the stated components which is processed by the method in accordance with various embodiments. A carrier can be altered in terms of the optical appearance, for example, by the method.

In various configurations, an adhesive may include or be formed from one of the following substances: a casein, a glutin, a starch, a cellulose, a resin, a tannin, a lignin, an organic substance including oxygen, nitrogen, chlorine and/or sulfur; a metal oxide, a silicate, a phosphate, a borate.

In various configurations, an adhesive may include or be formed from a hot melt adhesive, for example a solvent-containing wet adhesive, a contact adhesive, a dispersion adhesive, a water-based adhesive, a plastisol; a polymerization adhesive, for example a cyanacrylate adhesive, a methyl methacrylate adhesive, an anaerobically curing adhesive, an unsaturated polyester, a radiation-curing adhesive; a polycondensation adhesive, for example a phenol formaldehyde resin adhesive, a silicone, a silane-crosslinking polymer adhesive, a polyimide adhesive, a polysulfide adhesive; and/or a polyaddition adhesive, for example an epoxy resin adhesive, a polyurethane adhesive, a silicone, a pressure sensitive adhesive.

Furthermore, the adhesive can additionally include thermally conductive particles. The thermally conductive particles may include or be formed from one of the following substances: carbon nanotubes, diamond, copper, boron nitride, aluminum, aluminum nitride, and/or aluminum oxide. The thermal conductivity of the thermally conductive particles can be in a range of approximately 28 W/mK to approximately 6000 W/mK.

FIG. 2 shows schematic illustrations concerning a method 400 in accordance with various embodiments.

The method 200 for producing a component includes arranging a first mask structure on or above a substrate (202).

The method 200 includes arranging a second mask structure on or above the first mask structure (204). In this case, the first mask structure includes a first structuring region before the second mask structure is applied to the first mask structure. The first structuring region includes an opening and/or a region prepared for forming an opening. A region prepared for forming an opening can have for example predetermined separating locations, an altered adhesion, an altered cohesion and/or chemical resistance with regard to a solvent with regard to the first mask structure.

The method 200 includes forming a second structuring region in the first mask structure and in the second mask structure (206). The second structuring region is formed in the first mask structure in such a way that at least one part of the first structuring region in the first mask structure is formed outside the second structuring region in the first mask structure. Illustratively, the first structuring region can be formed at least partly alongside the first structuring region. Alternatively, the second structuring region can be formed completely within the dimensioning of the first structuring region, wherein the first structuring region is larger than the second structuring region.

Hereinafter (illustrated in FIGS. 3A-3I) the method 200 is illustrated on the basis of the example of a method for producing an optoelectronic component 400 (also see the description of FIG. 4). In each case a plan view of the component and underneath a schematic cross-sectional view 306 in the method 200 in accordance with various embodiments are illustrated.

By the method, at least one part of an optoelectronic component can be formed, wherein the optoelectronic component is formed with an optically active region for absorbing or emitting electromagnetic radiation; and an optically inactive region.

The optoelectronic component includes a first electrode, a second electrode and an organic functional layer structure, wherein the organic functional layer structure is formed between the first electrode and the second electrode.

The optoelectronic component can be formed for example as an organic light emitting diode, an organic solar cell and/or an organic photodetector. The optoelectronic component can be formed for example as a surface component. The optoelectronic component is described in more detail in FIG. 4.

Figure 3A:
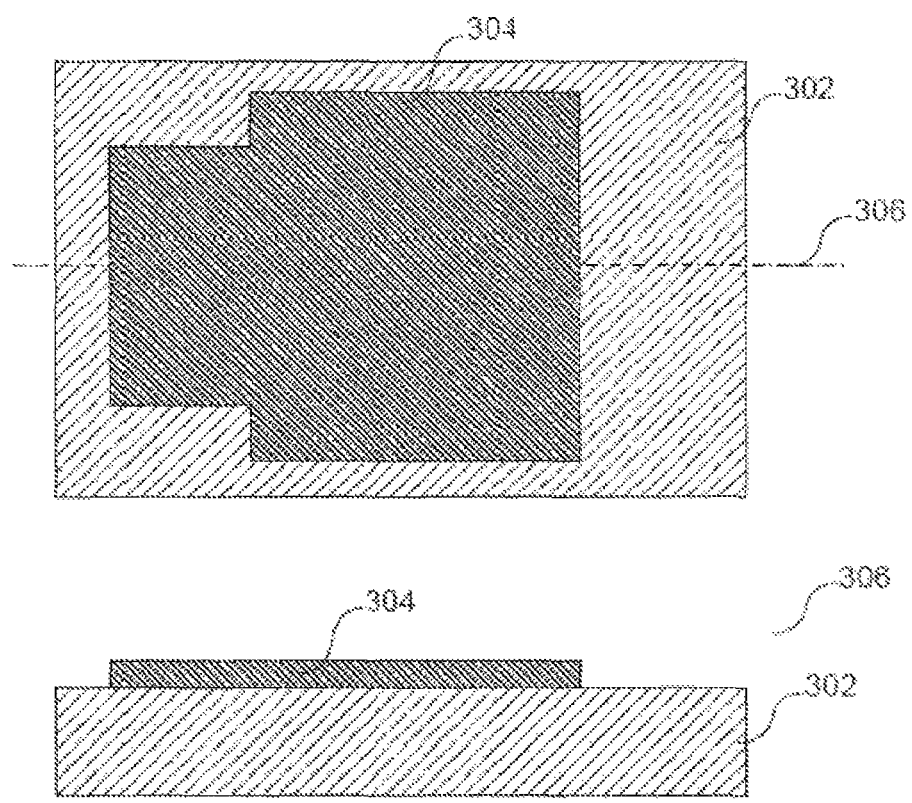

A first electrode 304 is formed on a substrate 302, for example as a prestructured anode, for example composed of ITO (illustrated in FIG. 3A).

Figure 3B:
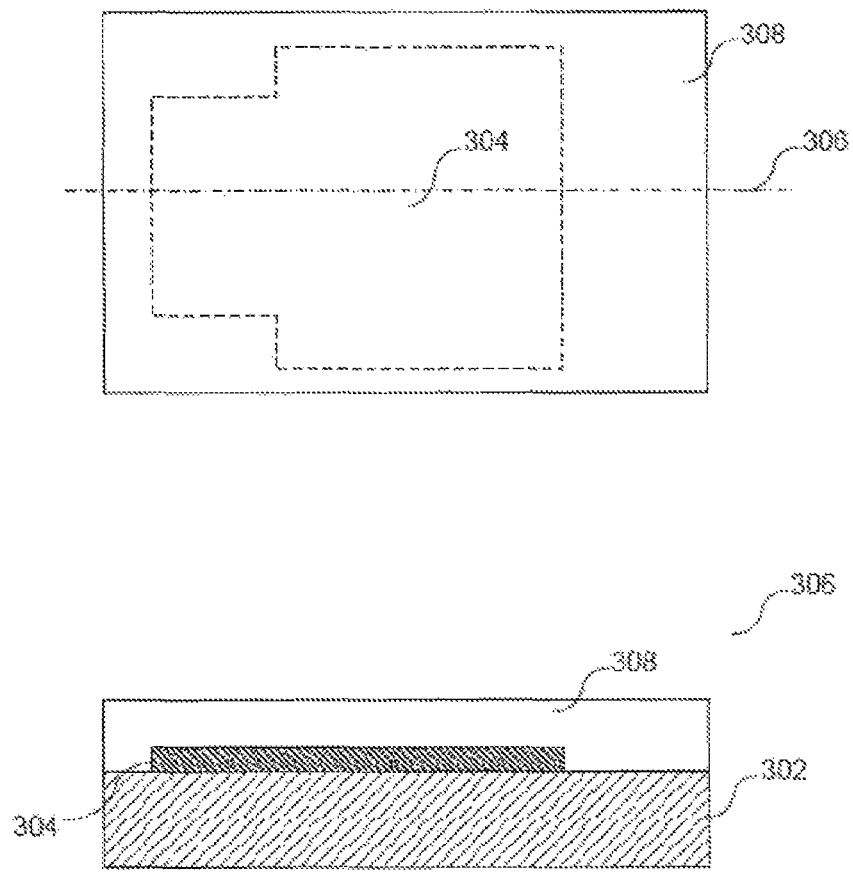

A first mask structure 308 is arranged on or above the substrate 302 to be coated (illustrated in FIG. 3B). The edge of the prestructured anode is not visible in the plan view of the substrate 302 with first mask structure 308. The dashed line is intended to illustrate the edge of the first electrode 304 merely for orientation purposes.

In various embodiments, the first mask structure 308 can be formed in a self-supporting fashion, for example. The first mask structure 308 can be arranged on or above the substrate 302, for example in the form of a film, a plate or a sheet.

The first mask structure 308 may include an adhesive layer and can be connected to the substrate 302 by the adhesive layer, for example as a self-adhesive film, a self-adhesive plate or a self-adhesive sheet.

In various embodiments, the first mask structure 308 can be formed as a coating on or above the substrate 302, for example in a manner removable in one piece.

The first mask structure 308 may include or be formed from a polymer, for example a polyolefin, for example a polyethylene or a polypropylene, a polyimide, a polyvinyl alcohol, a polyacrylate and/or a polyethylene terephthalate, a polysilicone, a polyethylene naphthalate, a polyvinyl chloride, a polystyrene, a polyester, a polycarbonate, polyethersulfone.

Furthermore, the first mask structure 308 may include or be formed from a bio-based material, for example a polylactide, a cellulose, a cellulose acetate and/or a starch mixture (starch blend). Furthermore, the first mask structure 308 can be formed as a laminate, for example composed of two or more materials.

Furthermore, the first mask structure 308 may include or be formed from a metal, for example in accordance with one of the configurations of the carrier 302, 402 of the optoelectronic component, for example in the form of a metal film, for example an aluminum film.

The first mask structure 308 may include a plurality of first mask structures, such that arranging the first mask structure 308 may include arranging a plurality of mask structures alongside one another, for example a plurality of separated first mask structures 308, for example as film pieces or regional films.

In one embodiment, the first mask structure 308 can be arranged in a physical contact on the substrate 302, for example by an adhesive connection. In another embodiment, the first mask structure 308 can be arranged in a holder above the substrate 302, for example in a frame. The holder can bear on the substrate, for example, wherein a distance can be formed between the substrate 302 and the first mask structure 308.

A first structuring region 310 can be formed in the first mask structure 308, wherein the first structuring region 310 may include one or a plurality of structurings 310A, B. The structurings 310A, B can have different shapes and/or dimensions and/or be arranged at different functional regions of the substrate or of the optoelectronic component, for example above the contact pads to be formed of the optoelectronic component.

In one embodiment, the first structuring region 310 can be formed at least partly in the first mask structure 308 before the first mask structure 308 is arranged on or above the substrate 302. By way of example, predetermined separating locations, different roughnesses and/or surface modifications can be formed in the first structuring region 310. A surface modification can be for example a silanization, thiolization and/or passivation.

In one embodiment, the first mask structure 308 can be formed on or above the substrate 302 in a structured fashion in the form of a coating in such a way that a first structuring region 310 is formed after the coating has been cured and/or crosslinked.

In one embodiment, the first structuring region 310 can be formed at least partly in the first mask structure 308 after the first mask structure 308 is arranged on or above the substrate 302 (illustrated in FIG. 3C). Illustratively, a structuring 310A, B is introduced or formed in the first mask structure 308, as a result of which, for example, two non-continuous, that is to say separated or segmented, regions of the mask structure 308 arise.

Forming the first structuring region 310 may include forming at least one of the following structurings 310A, B in the first mask structure 308: a hole, a predetermined separating location, a ring structure. The first structuring region 310 can be formed in such a way that it has a different adhesion with regard to the substrate 302, a different adhesion with regard to the second mask structure and/or a different cohesion than the first mask structure 308 outside the first structuring region 310, for example a different solubility with regard to a solvent or a different adhesive strength. In other words: the first structuring region 310 can be formed in such a way that two or more identical or different first structurings 310A, B are formed in the first mask structure 308, wherein the two or more first structurings 310A, B in the first mask structure 308 are arranged laterally alongside one another and/or wherein at least two of the first structurings 310A, B partly overlap in the first mask structure 308.

The region separated in the first mask structure 308 can be removed from the first mask structure 308, for example can be evaporated or removed mechanically, for example can be stripped away by a gripper or tweezers, for example by vacuum tweezers. By way of example, the first mask structure 308 can be a film mask 308 and at least one of the film segments 310A, B of the film mask 308 can be removed mechanically, thus resulting in at least one macroscopic open region in the mask film 308 (illustrated in FIG. 3C).

The above-described altered properties in the structuring region(s), for example the altered solubility or adhesive strength, can correspondingly be used to remove the structured and/or separated region. For example dissolving the separated region or heating the substrate, wherein the separated region having reduced adhesive strength loses its adhesion to the substrate and can thereby "drop off" earlier than the mask structure outside the structuring region.

However, the region separated in the first mask structure 308 in the structuring region can also remain in the first mask structure 308 after the structuring and can be removed only with or after the removal of a previously applied second mask structure. Illustratively, the region separated in the first mask structure 308 can be surrounded by the first mask structure 308, for example laterally, after the second mask structure has been arranged on or above the first mask structure 308. The region separated in the first mask structure 308 can thereby act as a supporting structure of the second mask structure, for example in the case of large-area first structuring regions, in the case of which the second masking structure might otherwise "sag". The first structuring region 310 can be formed in such a way that the separated region in the first mask structure 308 is removable areally in one piece, for example mechanically by an adhesive film or a lug on the masking structure.

Figure 3D:
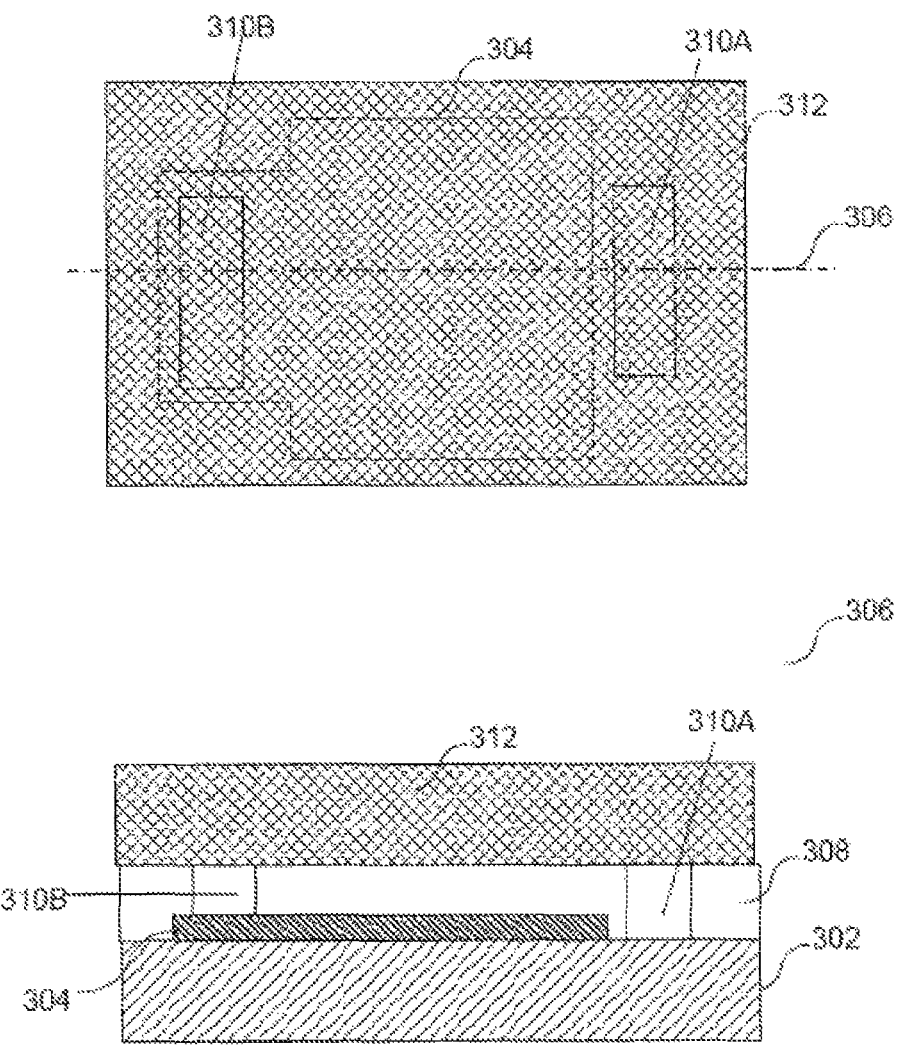

Subsequently, a second mask structure 312 is arranged on or above the first mask structure 308 (illustrated in FIG. 3D). The edges of the layers covered below the second mask structure 312 cannot be discerned in a plan view (the dashed lines of the layers below the second mask structure are intended merely to serve for orientation purposes).

The second mask structure 312 can be formed in accordance with one of the above-described configurations of the first mask structure 308, for example with regard to the first mask structure 308 instead of with regard to the substrate 302 as in the case of the first mask structure 308.

In one embodiment, the first mask structure 308 may include a position marking or such a position marking can be formed in the first mask structure 308 in such a way that the second mask structure 312 and/or the second structuring region are/is alignable with respect to the first masking structure and/or the first structuring region on the basis of the positing marking.

The first mask structure 308 and the second mask structure 312 form a mask double structure, also referred to as a mask structure stack. In the case of more than two mask structures, the mask double structure can also be referred to as a mask multiple structure. In the case of film masks 308, 312, the mask double structure can also be referred to as a film mask double layer. A structuring is once again introduced into the resultant mask double structure in a second structuring step, for example a second film structuring step. Said structuring is formed as second structuring region 314 at least partly in the first mask structure 308 and at least partly in the second mask structure 312. The second structuring region can be formed in accordance with one of the above-described configurations of the first structuring region. As a result, by way of example, at least two non-continuous, i.e. separated, regions 310A, B and 314 can be formed in the mask double structure. The part of the second structuring region 314 of the second mask structure 312 can be removed for example mechanically from the second mask structure, for example by a gripper, tweezers or vacuum tweezers, thus resulting in at least one opening in the mask double structure (illustrated in FIG. 3E). As a result, the mask double structure is formed in a segmented fashion, i.e. mutually different regions, that is to say segments, are formed in the mask double structure, for example the opening 314 and the second mask structure 312.

The second structuring region 314, that is to say for example the open regions defined in the second film structuring step in the mask double structure, can have a plurality of structurings. The plurality of structurings of the second structuring region 314 can be arranged at different locations than the structurings 310A, B; for example openings which are formed only in the first mask structure 308. However, the plurality of structurings of the second structuring region 314 can also partly or wholly overlap the first structurings 310A, B. Illustratively, in the case of entire overlapping, individual structurings 310A, B of the first structuring region 310 can lie completely within the second structuring region 314. During the removal of the second structuring region 314, the overlapped structurings 310A, B of the first structuring region 310 can be removed with the second structuring region 314. As a result, for example, individual structurings 310A, B of the first structuring region 310 can be exposed with the removal of the second structuring region 314, while other structurings 310A, B of the first structuring region 310 still remain in the first mask structure 308. This can be realized, for example, by individual structurings 310A, B of the first structuring region 310 being prestructured only in the first mask structure 308. As a result, a plurality of mask steps can be carried out with the first mask structure 308, without renewed alignment of the first mask structure 308.

The first structurings 310A, B which were removed from the first mask structure 308 and are not also removed by the second mask structuring step, that is to say the process of forming the second masking region 314, illustratively remain as cavities below the second mask structure 312 in the mask double structure.

As an alternative to the structuring of the first mask structure 308 and the mask double structure on the substrate 302, it is also possible for both mask structures 308, 312 or only the second mask structure 312, prior to being arranged on or above the substrate 302, for example prior to being applied to the substrate 302, to be prestructured with open regions or prepared regions, for example perforations. By way of example, only the second mask structure 312 can be structured before being applied above the substrate and the first mask structure 308 can be structured after being applied to the substrate.

In this case, open regions 314 of the second mask structure 312 can already be present or prepared as open regions in the first mask structure 308, for example by predetermined separating locations and/or altered adhesion and/or cohesion with regard to the mask structure. In a first processing step of the substrate 302, for example a coating step and/or removal step, a first layer or layer structure 316 can be formed, for example applied, on the substrate 302 (illustrated in FIG. 3F). The first layer 316 can be for example an organic functional layer structure 316—also see the description of FIG. 4. Illustratively, the mask double structure can be coated with a first material or material stack.

After, the second mask structure 312 can be removed mechanically; a further mask structure can be arranged on or above the second mask structure 312 or a further mask structure can be arranged on or above the first mask structure 308 after the second mask structure 312 has been removed.

The second mask structure 312 can be removed for example mechanically, for example by tweezers or a gripper, for example vacuum tweezers.

The applied first layer 316, i.e. the applied material, thus remains on the regions of the substrate 302 which correspond to the open regions 314 of the mask double structure (illustrated in FIG. 3G).

Figure 3H:
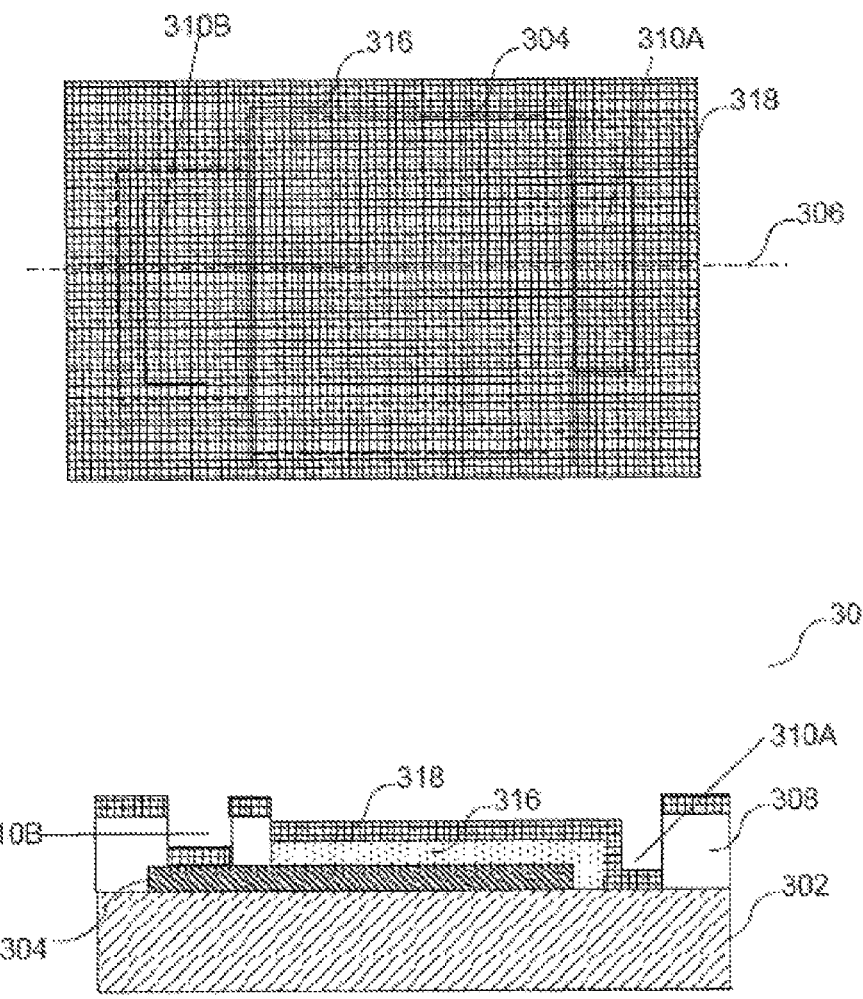
Figure 31:
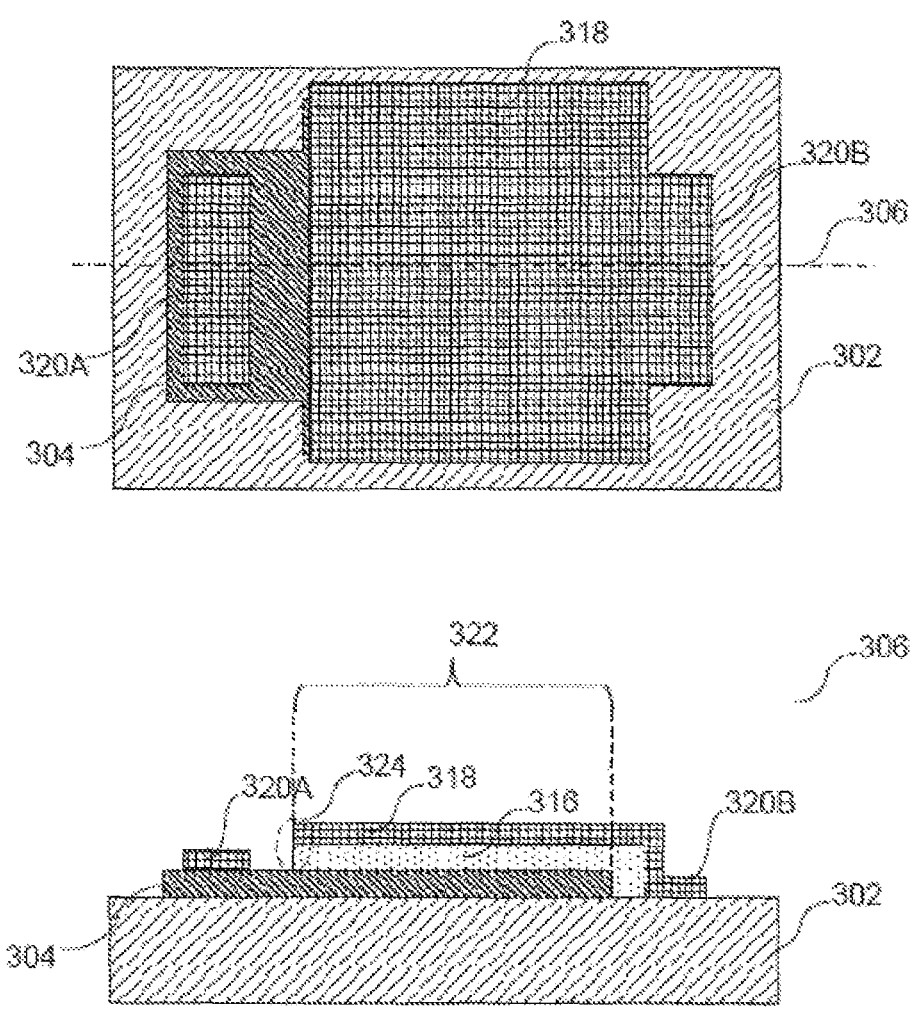

In a second processing step, for example a coating step and/or removal step, the substrate 302 with the remaining first mask structure 308 can be coated with a second material or material stack (illustrated in FIG. 3H). As a result, a second layer 318 can be applied on or above the first layer 316 and/or the substrate 302 in the first structuring region 310. The second layer 318 can be for example a second electrode 318, for example a specularly reflective top electrode;—also see the description of FIG. 4.

Afterward, the first mask structure 308 can remain on the substrate 302; can be removed mechanically; a new second mask structure 312 can be arranged on or above the first mask structure 308 or a new first mask structure can be arranged on or above the first substrate 302 with first layer 316 and second layer 318 after the first mask structure 308 has been removed.

The first mask structure 308 can be removed for example mechanically, for example by tweezers or a gripper, for example vacuum tweezers.

The second layer 318 can be formed for example on the regions of the substrate 302 which are defined by the open regions 310A, B of the first mask structure 308 (illustrated in FIG. 3I). As a result, for example, an optically active region 322 can be formed, wherein the region alongside the optically active region 322 is optically inactive. In the optically inactive region, for example, the contact pads 320A, 320B for externally electrically linking the organic functional layer structure 316 can be formed for example by the first structurings 310A, B. By the method 200, the second layer 318 and the first layer 316 can have a correspondence of the alignment, for example an automatic correspondence (auto-alignment), particularly in the region of the edges 324 of the layers 316, 318.

The first processing step can be applying and/or removing a single coating including/composed of a single material or a plurality of coatings can be applied and/or removed. As a result, a material stack can be formed, for example the organic functional layer structure 312 in an organic light emitting diode. Analogously, the second processing step may include applying and/or removing a single layer or a plurality of layers, for example forming a multilayered cathode of an organic light emitting diode.

Furthermore, in the first processing step and in the second processing step, the same material or the same material stack can be applied to the different regions of the substrate 302 and/or be removed. In various embodiments, a mask structure can be a customary temporarily adhesive, rereleaseable adhesive film having a relatively low adhesive strength, for example such as are commercially available from providers such as Kimoto, Tesa, 3M. These films generally consist of a polymeric base material, for example PET, with an adhesive coating, for example an acrylate adhesive.

The structuring of the first mask structure and of the second mask structure, for example by cutting the mask films, can be formed during the process of forming the first structuring region and/or the second structuring region by technically simple methods, for example by a cutting plotter or a laser cutter or other conventional film-processing methods. The mechanical removal of regions of the mask structures from the structuring regions can be carried out in an automated manner or manually, for example stripping away film segments in order to form open regions in the first mask structure or in the mask double structure. For this purpose, those regions of the mask structures which are to be removed can be gripped by tweezers or a mechanical gripper or can be lifted off by vacuum tweezers. The stripping away of the first mask structure and of the second mask structure after the respective processing step can be carried out "in line", that is to say in an automated manner within the coating installation. For this purpose, those regions of the mask structure which are to be removed can be lifted off by vacuum tweezers in an automated fashion, for example. Alternatively, the mask structures can be provided with lugs prior to the process of laminating onto the substrate 302, at which lugs a robot gripping arm can strip away the mask structure(s) from the substrate 302. As a result, the macroscopic mask structures and/or those regions of the mask structures which are to be removed can be mechanically removed in a technically simple manner, such that, for example, the process of film mask stripping away can be carried out "in line" in an automated fashion.

Mask structures which are arranged in holders above the substrate and/or one above another can be mechanically removed by "retracting" the respective holder from the region above the substrate.

The adhesion of the second mask structure with the first mask structure, that is to say the adhesive strengths should be set in such a way that the second mask structure is removable from the first mask structure. By way of example, the first mask structure can be adhesively bonded to the substrate by a first adhesive and the second mask structure can be adhesively bonded to the first mask structure by a second adhesive.

In order to detach the second mask structure from the first mask structure, the second adhesive should have a lower adhesive strength than the first adhesive. In this regard, it can be ensured that the first mask structure remains on the substrate when the second mask structure is stripped away. Temporary adhesive films having different adhesive strengths are commercially available, for example the adhesive film series "Prosave EP" from Kimoto, which is commercially available in three embodiments having different adhesive strengths: LS75 with 0.06 N/25 mm; MS75 with 0.103 N/25 mm; and HS75 with 0.89 N/25 mm on PET. As an alternative thereto, an adhesive film which loses its adhesive strength upon input of temperature or specific illumination, for example by UV irradiation, laser heating, can be used for the second mask structure. In this case, the substrate can be heated or illuminated after the first coating step, such that the second mask structure loses its adhesive strength and "drops off" from the substrate 302. The same principle can also be used for stripping away the first mask structure. In this case, care should be taken to ensure that the adhesive of the first mask structure loses its adhesive strength only with a higher energy input compared with when the adhesive of the second mask structure and/or loses its adhesive strength by a different mechanism, for example by UV light having a different wavelength or a temperature input instead of UV exposure.

Furthermore, it is possible to use different adhesive films including the same adhesive and different carrier films of the adhesive. An adhesive can have a different adhesive strength on different materials; by way of example, the adhesive strength of an adhesive on PET of the first mask film can be lower than the adhesive strength of said adhesive on the substrate, for example glass with ITO.

Furthermore, the surface of a mask film, for example of the first mask film, can be treated, such that the adhesive has a particularly low adhesive strength, i.e. adheres to a small degree, on it. Such a treatment may include for example applying a silicone, thiol, silane or fluoropolymer layer on the film surface of the mask film. Illustratively, this is evident in the case of a roll of conventional adhesive tape, in the case of which the adhesive hardly adheres on the adhesive tape itself, but adheres to a very great degree on virtually any arbitrary substrates.

In order to remove a region to be removed of the first mask structure with the second mask structure, the second adhesive in the region of the region to be removed of the first structuring region should have a greater adhesive strength than the first adhesive.

The first adhesive and/or the second adhesive can be formed in such a way that the adhesive strength is variable locally by external action. By way of example, the adhesive (depending on the specific configuration of the adhesive) can be crosslinked or degraded by a UV irradiation or a temperature input, for example a UV flash light lamp or a laser irradiation. Crosslinking of adhesive molecules can lead to an increase in the adhesive strength, and degradation can lead to separation of adhesive molecules, as a result of which the adhesive strength can be reduced.

Figure 4:
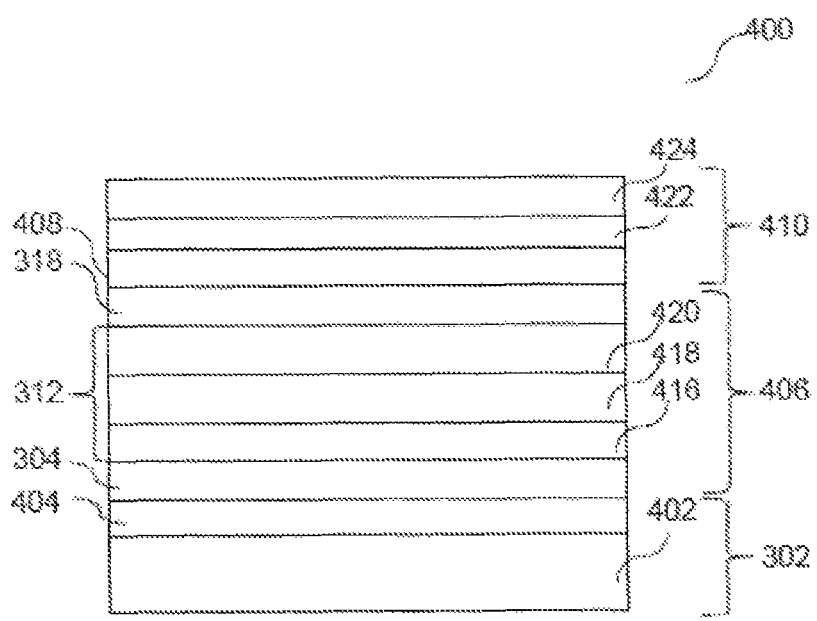
FIG. 4 shows a schematic cross-sectional view of an optoelectronic component in accordance with various embodiments.

FIG. 4 shows a schematic cross-sectional view of an optoelectronic component in accordance with various embodiments.

The optoelectronic component 400 can be formed partly or completely by a method 200 in accordance with an embodiment described above.

The optoelectronic component 400 can be designed for taking up and/or providing electromagnetic radiation in such a way that an electrical energy is generated from electromagnetic radiation taken up and/or electromagnetic radiation is generated from an electrical energy provided.

The optoelectronic component 400 can be formed as an organic light emitting diode 400, an organic photodetector 400 or an organic solar cell.

An organic light emitting diode 400 can be formed as a top emitter or a bottom emitter. In the case of a bottom emitter, light is emitted from the electrically active region through the carrier. In the case of a top emitter, light is emitted from the top side of the electrically active region and not through the carrier.

A top emitter and/or bottom emitter can also be formed as optically transparent or optically translucent; by way of example, each of the layers or structures described below can be formed as transparent or translucent.

The optoelectronic component includes a hermetically impermeable substrate 302, an active region 406 and an encapsulation structure 410.

The active region is an electrically active region and/or an optically active region. The active region is for example the region of the optoelectronic component 400 in which electric current for the operation of the optoelectronic component 400 flows and/or in which electromagnetic radiation is generated and/or absorbed.

The hermetically permeable substrate 302 may include the carrier 402 and a first barrier layer 404.

The electrically active region 406 may include a first electrode 304, an organic functional layer structure 312 and a second electrode 318.

The organic functional layer structure 312 may include a first organic functional layer structure unit 416, an intermediate layer 418 and a second organic functional layer structure unit 420.

The organic functional layer structure 406 may include one, two or more functional layer structure units and one, two or more intermediate layers between the layer structure units.

The encapsulation structure may include a second barrier layer 408, a close connection layer 422 and a cover 424.

The carrier 402 may include or be formed from glass, quartz and/or a semiconductor material or any other suitable material. Furthermore, the carrier may include or be formed from a plastics film or a laminate including one or including a plurality of plastics films. The plastic may include or be formed from one or a plurality of polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN).

The carrier 402 may include or be formed from a metal, for example copper, silver, gold, platinum, iron, for example a metal compound, for example steel.

The carrier 402 can be embodied as translucent or even transparent.

The carrier 402 can be a part of a mirror structure or form the latter.

The carrier 402 can have a mechanically rigid region and/or a mechanically flexible region or be formed in this way.

The carrier 402 can be formed as a waveguide for electromagnetic radiation, for example can be transparent or translucent with respect to the emitted or absorbed electromagnetic radiation of the optoelectronic component 400.

The first barrier layer 404 may include or be formed from one of the following materials: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, and mixtures and alloys thereof.

The first barrier layer 404 can be formed by one of the following methods: an atomic layer deposition (ALD) method, for example a plasma enhanced atomic layer deposition (PEALD) method or a plasmaless atomic layer deposition (PLALD) method; a chemical vapor deposition (CVD) method, for example a plasma enhanced chemical vapor deposition (PECVD) method or a plasmaless chemical vapor deposition (PLCVD) method; or alternatively by other suitable deposition methods.

In the case of a first barrier layer 404 including a plurality of partial layers, all the partial layers can be formed by an atomic layer deposition method. A layer sequence including only ALD layers can also be designated as a "nanolaminate".

In the case of a first barrier layer 404 including a plurality of partial layers, one or a plurality of partial layers of the second barrier layer 408 can be deposited by a different deposition method than an atomic layer deposition method, for example by a vapor deposition method.

The first barrier layer 404 can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

The first barrier layer 404 may include one or a plurality of high refractive index materials, for example one or a plurality of materials having a high refractive index, for example having a refractive index of at least 2.

Furthermore, it should be pointed out that, in various embodiments, a first barrier layer 404 can also be entirely dispensed with, for example for the case where the carrier 402 is formed in a hermetically impermeable fashion.

The first electrode 304 can be formed as an anode or as a cathode.

The first electrode 304 may include or be formed from one of the following electrically conductive materials: a metal; a transparent conductive oxide (TCO); a network composed of metallic nanowires and nanoparticles, for example composed of Ag, which are combined with conductive polymers, for example; a network composed of carbon nanotubes which are combined with conductive polymers, for example; graphene particles and graphene layers; a network composed of semiconducting nanowires; an electrically conductive polymer; a transition metal oxide; and/or the composites thereof. The first electrode 304 composed of a metal or including a metal may include or be formed from one of the following materials: Ag, Pt, Au, Mg, Al, Ba, In, Ca, Sm or Li, and compounds, combinations or alloys of these materials. The first electrode 304 may include as transparent conductive oxide one of the following materials: for example metal oxides: for example zinc oxide, tin oxide, cadmium oxide, titanium oxide, indium oxide, or indium tin oxide (ITO). Alongside binary metal-oxygen compounds, such as, for example, $ZnO$, $SnO_2$, or $In_2O_3$, ternary metal-oxygen compounds, such as, for example, $AlZnO$, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs and can be used in various embodiments. Furthermore, the TCOs do not necessarily correspond to a stoichiometric composition and can furthermore be p-doped or n-doped or be hole-conducting (p-TCO), or electron-conducting (n-TCO).

The first electrode 304 may include a layer or a layer stack of a plurality of layers of the same material or different materials. The first electrode 304 can be formed by a layer stack of a combination of a layer of a metal on a layer of a TCO, or vice versa. One example is a silver layer applied on an indium tin oxide layer (ITO) (Ag on ITO) or ITO—Ag-ITO multilayers.

The first electrode 304 can have for example a layer thickness in a range of 10 nm to 500 nm, for example of less than 25 nm to 250 nm, for example of 50 nm to 100 nm.

The first electrode 304 can have a first electrical terminal, to which a first electrical potential can be applied. The first electrical potential can be provided by an energy source (not shown), for example a current source or a voltage source. Alternatively, the first electrical potential can be applied to an electrically conductive carrier 402 and the first electrode 304 can be electrically supplied indirectly through the carrier 402. The first electrical potential can be for example the ground potential or some other predefined reference potential.

FIG. 4 illustrates an optoelectronic component 400 including a first organic functional layer structure unit 416 and a second organic functional layer structure unit 420. In various embodiments, however, the organic functional layer structure 312 can also include more than two organic functional layer structures, for example 3, 4, 5, 6, 7, 8, 9, 10, or even more, for example 15 or more, for example 70.

The first organic functional layer structure unit 416 and the optionally further organic functional layer structures can be formed identically or differently, for example include an identical or different emitter material. The second organic functional layer structure unit 420, or the further organic functional layer structure units can be formed like one of the below-described configurations of the first organic functional layer structure unit 416.

The first organic functional layer structure unit 416 may include a hole injection layer, a hole transport layer, an emitter layer, an electron transport layer and an electron injection layer.

In an organic functional layer structure unit 312, one or a plurality of the layers mentioned can be provided, wherein identical layers can have a physical contact, can be only electrically connected to one another or can even be formed in a manner electrically insulated from one another, for example can be arranged alongside one another. Individual layers of the layers mentioned can be optional.

A hole injection layer can be formed on or above the first electrode 304. The hole injection layer may include or be formed from one or a plurality of the following materials: HAT-CN, Cu(I)pFBz, $MoO_x$, $WO^x$, $VO^x$, $ReO_x$, F4-TCNQ, NDP-2, NDP-9, Bi(III)pFBz, F16CuPc; NPB (N,N'-bis(naphthalen-1-yl)-N,N'-bis(phenyl)benzidine); beta-NPB N,N'-bis(naphthalen-2-yl)-N,N'-bis(phenyl)benzidine); TPD (N,N'-bis(3-methylphenyl)-N,N'-bis(phenyl)benzidine); spiro TPD (N,N'-bis(3-methylphenyl)-N,N'-bis(phenyl)benzidine); spiro-NPB (N,N'-bis(naphthalen-1-yl)-N, N'-bis(phenyl)spiro); DMFL-TPD N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(n,n-diphenylamino)-9,9'-spirobifluorene); 9,9-bis[4-(N,N-bis-biphenyl-4-yl-amino)phenyl]-9H-fluorene; 9,9-bis[4-(N,N-bisnaphthalen-2-yl-amino)phenyl]-9H-fluorene; 9,9-bis[4-(N,N'-bisnaphthalen-2-yl-N,N'-bisphenylamino)phenyl]-9H-fluorene; N,N'-bis(phenanthren-9-yl)-N,N'-bis(phenyl) benzidine; 2,7-bis[N,N-bis(9,9-spirobifluoren-2-yl)amino]-9,9-spirobifluorene; 2,2'-bis[N,N-bis(biphenyl-4-yl)amino] 9, 9-spirobifluorene; 2,2'-bis(N,N-diphenylamino) 9, 9-spirobifluorene; di-[4-(N,N-ditolylamino)phenyl]cyclohexane; 2,2',7,7'-tetra(N,N-di-tolyl)aminospirobifluorene; and/or N,N,N',N'-tetranaphthalen-2-ylbenzidine.

The hole injection layer can have a layer thickness in a range of approximately 10 nm to approximately 1000 nm, for example in a range of approximately 30 nm to approximately 300 nm, for example in a range of approximately 50 nm to approximately 200 nm.

A hole transport layer can be formed on or above the hole injection layer. The hole transport layer may include or be formed from one or a plurality of the following materials: NPB (N,N'-bis(naphthalen-1-yl)-N,N'-bis(phenyl)benzidine); beta-NPB N,N'-bis(naphthalen-2-yl)-N,N'-bis(phenyl)benzidine); TPD (N,N'-bis(3-methylphenyl)-N,N'-bis(phenyl)benzidine); spiro TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); Spiro-TAD (2,2',7,7'-tetrakis(n,n-diphenylamino)-9,9'-spirobifluorene); 9,9-bis[4-(N,N-bisbiphenyl-4-yl-amino)phenyl]-9H-fluorene; 9,9-bis[4-(N,N-bisnaphthalen-2-ylamino)phenyl]-9H-fluorene; 9,9-bis[4-(N,N'-bisnaphthalen-2-yl-N—N'-bisphenylamino)-phenyl]-9H-fluorene; N,N'-bis(phenanthren-9-yl)-N,N'-bis(phenyl) benzidine; 2,7-bis[N,N-bis(9,9-spirobifluoren-2-yl)amino]-9,9-spirobifluorene; 2,2'-bis[N,N-bis(biphenyl-4-yl)amino] 9,9-spirobifluorene; 2,2'-bis(N,N-diphenylamino)9,9-spirobifluorene; di-[4-(N,N-ditolylamino)phenyl] cyclohexane; 2,2',7,7'-tetra(N,N-di-tolyl) aminospirobifluorene; and N,N,N',N'-tetranaphthalen-2-yl-benzidine, a tertiary amine, a carbazole derivative, a conductive polyaniline and/or polyethylene dioxythiophene.

The hole transport layer can have a layer thickness in a range of approximately 5 nm to approximately 50 nm, for example in a range of approximately 10 nm to approximately 30 nm, for example approximately 20 nm.

An emitter layer can be formed on or above the hole transport layer. Each of the organic functional layer structure units 416, 420 may include in each case one or a plurality of emitter layers, for example including fluorescent and/or phosphorescent emitters.

The one or the plurality of electroluminescent layers may include organic polymers, organic oligomers, organic monomers, organic small, non-polymeric molecules ("small molecules") or a combination of these materials.

The optoelectronic component 400 may include or be formed from one or a plurality of the following materials in an emitter layer: organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FlrPic (bis(3,5-difluoro-2-(2-pyridyl)phenyl(2-carboxypyridyl) iridium III), green phosphorescent $Ir(ppy)_3$ (tris(2-phenylpyridine)iridium III), red phosphorescent Ru $(dtb-bpy)_3*2(PF_6)$ (tris[4,4'-di-tert-butyl-(2,2')-bipyridine]ruthenium(III) complex) and blue fluorescent DPAVBi (4,4-bis[4-(di-p-tolylamino)styryl]biphenyl), green fluorescent TTPA (9,10-bis[N,N-di(p-tolyl) amino]anthracene) and red fluorescent DCM2 (4-dicyanomethylene)-2-methyl-6-julolidyl-9-enyl-4H-pyran) as non-polymeric emitters.

Such non-polymeric emitters can be deposited for example by thermal evaporation. Furthermore, polymer emitters can be used which can be deposited for example by a wet-chemical method, such as, for example, a spin coating method.

The emitter materials can be embedded in a suitable manner in a matrix material, for example a technical ceramic or a polymer, for example an epoxy; or a silicone.

In various embodiments, the first emitter layer 434 can have a layer thickness in a range of approximately 5 nm to approximately 50 nm, for example in a range of approximately 10 nm to approximately 30 nm, for example approximately 20 nm.

The emitter layer may include emitter materials that emit in one color or in different colors (for example blue and yellow or blue, green and red). Alternatively, the emitter layer may include a plurality of partial layers which emit light of different colors. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The organic functional layer structure unit 416 may include one or a plurality of electroluminescent layers embodied as hole transport layer.

Furthermore, the organic functional layer structure unit 416 may include one or a plurality of emitter layers embodied as electron transport layer.

Furthermore, an electron transport layer can be formed, for example deposited, on or above the emitter layer.

The electron transport layer may include or be formed from one or a plurality of the following materials: NET-18; 2,2',2"-(1,3,5-benzinetriyl)tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium; 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-naphthalen-2-yl)phenyl)-1H-imidazo[4,5-f][1,10]phenanthroline; phenyl-dipyrenylphosphine oxide; naphthalenetetracarboxylic dianhydride or the imides thereof; perylenetetracarboxylic dianhydride or the imides thereof; and substances based on silols including a silacyclopentadiene unit.

The electron transport layer can have a layer thickness in a range of approximately 5 nm to approximately 50 nm, for example in a range of approximately 10 nm to approximately 30 nm, for example approximately 20 nm.

An electron injection layer can be formed on or above the electron transport layer. The electron injection layer may include or be formed from one or a plurality of the following materials: NDN-26, MgAg, $Cs_2CO_3$, $Cs_3PO_4$, Na, Ca, K, Mg, Cs, Li, LiF; 2,2',2"-(1,3,5-benzinetriyl)tris(1-phenyl-1-H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium, 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis([5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10]phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron injection layer can have a layer thickness in a range of approximately 5 nm to approximately 200 nm, for example in a range of approximately 20 nm to approximately 50 nm, for example approximately 30 nm.

In the case of an organic functional layer structure 312 including two or more organic functional layer structure units 416, 420, the second organic functional layer structure unit 420 can be formed above or alongside the first functional layer structure units 416. An intermediate layer 418 can be formed between the organic functional layer structure units 416, 420.

In various embodiments, the intermediate layer 418 can be formed as an intermediate electrode 418 in accordance with one of the configurations of the first electrode 304. An intermediate electrode 418 can be electrically connected to an external voltage source. The external voltage source can provide a third electrical potential, for example at the intermediate electrode 418. However, the intermediate electrode 418 can also have no external electrical connection, for example by the intermediate electrode having a floating electrical potential.

In various embodiments, the intermediate layer 418 can be formed as a charge generating layer structure 418 (charge generation layer CGL). A charge generating layer structure 418 may include one or a plurality of electron-conducting charge generating layer(s) and one or a plurality of hole-conducting charge generating layer(s). The electron-conducting charge generating layer(s) and the hole-conducting charge generating layer(s) can be formed in each case from an intrinsically conductive substance or a dopant in a matrix. The charge generating layer structure 418 should be formed, with respect to the energy levels of the electron-conducting charge generating layer(s) and the hole-conducting charge generating layer(s), in such a way that electron and hole can be separated at the interface between an electron-conducting charge generating layer and a hole-conducting charge generating layer. The charge generating layer structure 418 can have an intermediate layer structure acting as a diffusion barrier, for example, between adjacent layers.

In embodiments in which more than two organic functional layer structures are provided, a respective charge generating layer structure can be provided between in each case two organic functional layer structures.

Each organic functional layer structure unit 416, 420 can have for example a layer thickness of a maximum of approximately 3 µm, for example a layer thickness of a maximum of approximately 1 µm, for example a layer thickness of a maximum of approximately 300 nm.

The optoelectronic component 400 can optionally include further organic functional layers, for example arranged on or above the one or the plurality of emitter layers or on or above the electron transport layer(s). The further organic functional layers can be for example internal or external coupling-in/coupling-out structures that further improve the functionality and thus the efficiency of the optoelectronic component 400.

The second electrode 318 can be formed on or above the organic functional layer structure 312 or, if appropriate, on or above the one or the plurality of further organic functional layers.

The second electrode 318 can be formed in accordance with one of the configurations of the first electrode 304, wherein the first electrode 304 and the second electrode 318 can be formed identically or differently. The second electrode 318 can be formed as an anode, that is to say as a hole-injecting electrode, or as a cathode, that is to say as an electron-injecting electrode.

The second electrode 318 can have a second electrical terminal, to which a second electrical potential can be applied. The second electrical potential can be provided by the same energy source as, or a different energy source than, the first electrical potential and/or the optional third electrical potential. The second electrical potential can be different than the first electrical potential and/or the optionally third electrical potential. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

The second barrier layer 408 can also be referred to as thin film encapsulation. The second barrier layer 408 can be formed in accordance with one of the configurations of the first barrier layer 404.

Furthermore, it should be pointed out that, in various embodiments, a second barrier layer 408 can also be entirely dispensed with. In such a configuration, the optoelectronic component 400 may include for example a further encapsulation structure, as a result of which a second barrier layer 408 can become optional, for example a cover 424, for example a cavity glass encapsulation or metallic encapsulation.

Furthermore, in various embodiments, in addition, one or a plurality of coupling-in/-out layers can also be formed in the optoelectronic component 400, for example an external coupling-out film on or above the carrier 402 (not illustrated) or an internal coupling-out layer (not illustrated) in the layer cross section of the optoelectronic component 400. The coupling-in/-out layer may include a matrix and scattering centers distributed therein, wherein the average refractive index of the coupling-in/-out layer is greater than the average refractive index of the layer from which the electromagnetic radiation is provided. Furthermore, in various embodiments, in addition, one or a plurality of antireflection layers (for example combined with the second barrier layer 408) can be provided in the optoelectronic component 400.

In various embodiments, a close connection layer 422, for example composed of an adhesive or a lacquer, can be provided on or above the second barrier layer 408. By the close connection layer 422, a cover 424 can be closely connected, for example adhesively bonded, on the second barrier layer 408.

The close connection layer 422 can be formed as transparent or translucent.

A close connection layer 422 composed of a transparent material may include for example particles which scatter electromagnetic radiation, for example light-scattering particles. As a result, the close connection layer 422 can act as a scattering layer and lead to an improvement in the color angle distortion and the coupling-out efficiency.

The light-scattering particles provided can be dielectric scattering particles, for example, composed of a metal oxide, for example, silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide, or titanium oxide. Other particles may also be suitable provided that they have a refractive index that is different than the effective refractive index of the matrix of the close connection layer 422, for example air bubbles, acrylate, or hollow glass beads. Furthermore, by way of example, metallic nanoparticles, metals such as gold, silver, iron nanoparticles, or the like can be provided as light-scattering particles.

The close connection layer 422 can have a layer thickness of greater than 1 µm, for example a layer thickness of a plurality of µm. In various embodiments, the close connection layer 422 may include or be a lamination adhesive.

The close connection layer 422 can be designed in such a way that it includes an adhesive having a refractive index that is less than the refractive index of the cover 424. Such an adhesive can be for example a low refractive index adhesive such as, for example, an acrylate having a refractive index of approximately 1.3. However, the adhesive can also be a high refractive index adhesive which for example includes high refractive index, non-scattering particles and has a layer-thickness-averaged refractive index that approximately corresponds to the average refractive index of the organic functional layer structure 312, for example in a range of approximately 1.7 to approximately 2.0. Furthermore, a plurality of different adhesives can be provided which form an adhesive layer sequence.

In various embodiments, between the second electrode 318 and the close connection layer 422, an electrically insulating layer (not shown) can also be applied, for example SiN, for example having a layer thickness in a range of approximately 300 nm to approximately 1.5 µm, for example having a layer thickness in a range of approximately 500 nm to approximately 1 µm, in order to protect electrically unstable materials, during a wet-chemical process for example.

In various embodiments, a close connection layer 422 can be optional, for example if the cover 424 is formed directly on the second barrier layer 408, for example a cover 424 composed of glass that is formed by plasma spraying.

Furthermore, a so-called getter layer or getter structure, for example a laterally structured getter layer, can be arranged (not illustrated) on or above the electrically active region 406.

The getter layer may include or be formed from a material that absorbs and binds substances that are harmful to the electrically active region 406. A getter layer may include or be formed from a zeolite derivative, for example. The getter layer can be formed as translucent, transparent or opaque. The getter layer can have a layer thickness of greater than approximately 1 µm, for example a layer thickness of a plurality of µm.

In various embodiments, the getter layer may include a lamination adhesive or be embedded in the close connection layer 422.

A cover 424 can be formed on or above the close connection layer 422. The cover 424 can be closely connected to the electrically active region 406 by the close connection layer 422 and can protect said region from harmful substances. The cover 424 can be for example a glass cover 424, a metal film cover 424 or a sealed plastics film cover 424. The glass cover 424 can be closely connected to the second barrier layer 408 or the electrically active region 406 for example by frit bonding (glass soldering/seal glass bonding) by a conventional glass solder in the geometric edge regions of the organic optoelectronic component 400.

The cover 424 and/or the close connection layer 422 can have a refractive index (for example at a wavelength of 633 nm) of 1.55.

Figure 5A:
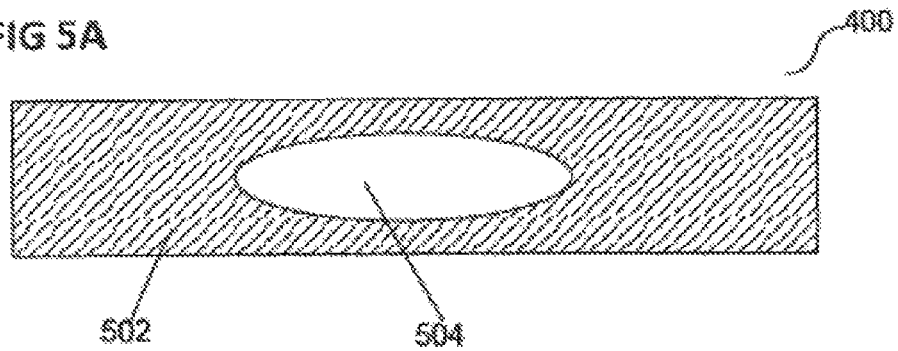
FIGS. 5A-5C show schematic illustrations of embodiments of optoelectronic components.
Figure 5B:
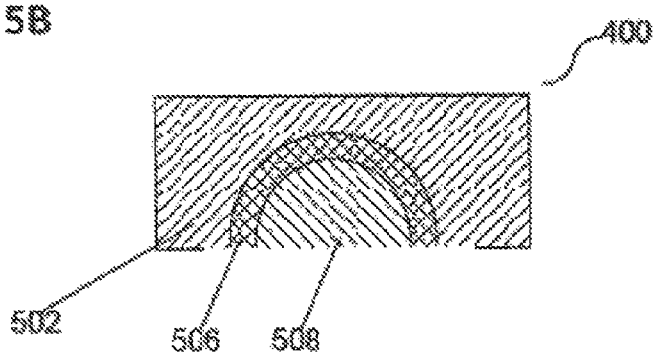
Figure 5C:
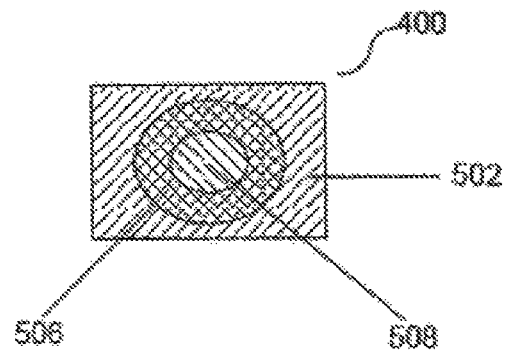

FIGS. 5A-5C show schematic illustrations of embodiments of optoelectronic components.

FIGS. 5A-5C illustrate embodiments of an organic light emitting diode as an optoelectronic component 400 which are producible by the method in accordance with one of the embodiments described above. By the method, the planar optically active region can be structured in such a way that information can be represented, for example an ideogram, a pictogram and/or lettering; a look through hole, a window and/or a see through opening.

The organic light emitting diode 400 may include a planar optically active region 502. By way of example, a transparent, optically inactive region 504 and/or a transparent optically active region can be formed in the optically active region 502 (illustrated in FIG. 5A), for example a look through hole or a window in the optically active area. By way of example, the planar optically active region 502 can be embodied as a bottom or top emitter OLED and a region with a transparent OLED can be formed in the optically active region. Such structures are producible only with very great difficulty by conventional mask methods with the use of a transparent cathode or by multi-mask coating and additional lithography steps using resist. By conventional methods, residual materials remained in the optically inactive cutout 504, which influence the transparency and the optical appearance in the switched-off state (off-state appearance), and switched-on state (on-state appearance). By the method 200 with the first mask structure and the second mask structure in accordance with configurations described above, a completely transparent look through hole can be formed. The complete transparency is the maximum achievable transparency taking account of the transparency of substrate 302 and encapsulation structure (410—see FIG. 4).

Furthermore, an organic light emitting diode having luminous or design areas 502, 506, 508 which are electrically insulated from one another can be formed (illustrated in FIG. 5B and FIG. 5C), for example in circular and/or ring-shaped fashion. Such structures have a common cathode by conventional lithography methods. That is to say that the driving as to whether or not a luminous area 502, 506, 508 is operated is effected merely by the regulation of the anode. This poses problems, however, in the case of a combination of the luminous function with other functions of the optoelectronic component, for example touch sensors for switching the luminous areas on or off. An additional structuring of the cathode is possible by conventional methods only in a web width range of up to 5 mm, since finer structures in the shadow mask would sag and thus require an additional, thick supporting mask having a thickness of 1.5 cm, for example. These wide webs are optical dead regions in the optically active area of the organic light emitting diode.

In various embodiments, a method for producing a component is provided which makes it possible to apply the lateral structuring of a plurality of stacked functional thin layers to a substrate during their deposition, in order, for example in a functional thin-film system, to apply different layers to partly different lateral regions of the substrate. The use of mask films instead of the customary metallic shadow masks entails a cost saving since the comparatively expensive metallic masks and the regular cleaning thereof are obviated. Moreover, new component designs that demand the deposition of materials into different regions than hitherto can be implemented faster since there is no need first for a new metal shadow mask, rather only the programming of the film cutting tool, for example of a cutting plotter, need be adapted. Since the film mask can be situated directly on the substrate, the lateral definition of the coated regions is better than in the case of a metallic shadow mask arranged at a small distance above the substrate. In particular, possible fault sources are eliminated such as sagging or flexure, for example on account of thermal warpage during the coating of metallic mask or substrate. This can happen in conventional methods and lead to a lateral widening of the coated region by the increased distance between substrate and mask. Even in the fault-free conventional process using metallic shadow masks, a gentle tapering of the coated region, i.e. a thickness gradient of the deposited layer at the edge thereof, occurs in principle as a result of the shadow casting. In contrast thereto, the deposited material layer with the use of the mask films has a sharp edge since the adjoining regions of the substrate were covered by the mask film in direct contact during the coating process, such that no vapor admission from underneath is possible. By a use of mask films, it is possible in a technically simpler manner to implement OLED designs in which luminous OLED areas lie within other OLED regions (for example concentric rings) or in which a luminous region encloses a non-luminous, non-coated region, e.g. an OLED having a look through hole, a window, a see through opening or a non-transparent but non-luminous region. With metallic shadow masks this is conceivable only with very complex and cost-intensive multi-mask processes which necessitate a multiply repeated coating with the material to be applied. Furthermore, by a use of film masks it is possible in a simple manner to produce individual luminous regions situated close together, without the intervening non-luminous regions being widened to a number of millimeters, as is necessary in the case of metallic shadow masks.

A further advantage of film masks is the flexibility thereof, as a result of which they can be used even on surfaces that are not planar. A structured coating of bent or differently shaped areas or of three-dimensional bodies is thus made possible. For this purpose, the mask films can be applied to an initially planar, flexible substrate and then be brought to shape jointly therewith, or can be applied directly to a substrate that has already been shaped.

With the use of a plurality of conventional shadow masks, the latter are changed between the coating steps, wherein their accurate positioning is usually effected mechanically, which entails inaccuracies of hundreds of micrometers in the lateral position of the various material layers. The consequence is design rules for OLEDs which take account of these inaccuracies, for example with regard to the positioning of contact areas in relation to active luminous areas or with regard to the position of all deposited layers on the substrate. As a result, the maximum active luminous area of the OLED is reduced by these tolerances of the mask positioning. With the use of a plurality of stacked mask structures in accordance with various embodiments, this is different, for example with the use of film masks adhesively bonded onto one another. During the structuring of the second, upper film mask, the first, lower film mask is structured simultaneously. Regions which are coated with material in the first coating step through the second, upper film mask can be coated with material at the same location in the second coating step, too, through the first, lower film mask. Both layers can therefore be formed automatically in perfect registration, that is to say that an auto-alignment of top second electrode and organic functional layer structure can be present in the case of the OLED with organic functional layer structure between anode and cathode. This allows narrower design rules and thus increases the maximum area usable as luminous area on the substrate, which is accompanied by a cost saving by better material utilization.

In the structuring step, the film masks can merely be segmented. The open regions can subsequently be produced by whole film pieces being stripped away from the substrate. This is advantageous compared with conventional methods in which open regions are structured directly into the mask film and the method of laser ablation is preferably used therefore. Laser ablation tends toward production of particles, as a result of which subsequent process steps such as thin-film deposition or component encapsulation can be disadvantageously influenced.

Both mask structures can be applied on the substrate before the beginning of the coating process, for example by the adhesive bonding of the adhesive films and the structuring thereof. In this case, in part different regions can be exposed in the lower, first mask structure than in the upper, second mask structure. This allows coating of different regions of the substrate in the individual coating steps. In the coating process, after the first coating step, the upper, second mask structure can be removed mechanically by stripping away, for example in line in the coating process installation, which replaces a mask change in a conventional method. The problems resulting from the use of a plurality of individual film masks in conventional methods are avoided as a result. In this case, after the first coating step the substrate would be fetched from the coating installation and provided with the second film mask, which can bring about the degradation, contamination and damage of the first deposited material, for example of the organic functional layer structure in an organic light emitting diode. Stripping away the upper film mask in line in the method can potentially be carried out faster than changing conventional metallic shadow masks, which might save process time in the coating and thus increase the cycle rate.

An alternative method for producing the optoelectronic component is described below. In particular, at least one of the mask structures is produced in an alternative way in this method; the other steps of the method and/or many of the advantages mentioned above can readily be applied to the method described below.

In the method, the first electrode 304 can be formed on the substrate 302 in a manner corresponding to the step described in FIG. 3A.

Then, with reference to FIGS. 3B and 3C, the first mask structure 308 can be formed, in particular applied and/or structured, above the first electrode 304 or above at least one part of the first electrode 304. The first mask structure 308 is formed, in particular, such that the first structuring region 310 overlaps the first electrode 304. The first mask structure 308 can firstly be applied over the whole area and subsequently be structured or the first mask structure 308 can be applied in a structured state. The first mask structure 308 is applied to the substrate 302 as a coating in particular in a liquid state. In particular, the material of the coating is applied to the substrate 302 in a liquid state. The coating is cured and/or dried above the substrate 302, as a result of which the first mask structure 308 is formed.

Figure 6:
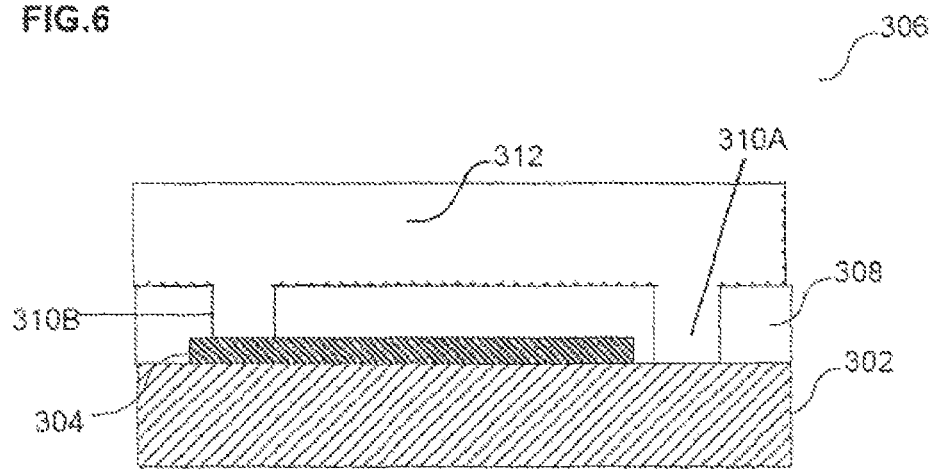
FIG. 6 shows a schematic illustration of a component in the method in accordance with various embodiments.
Figure 7:
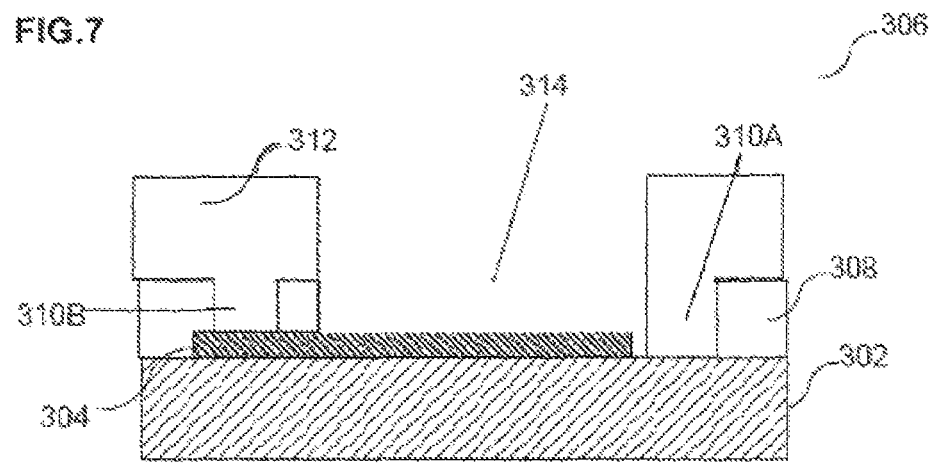
FIG. 7 shows a schematic illustration of a component in the method in accordance with various embodiments.
Figure 8:
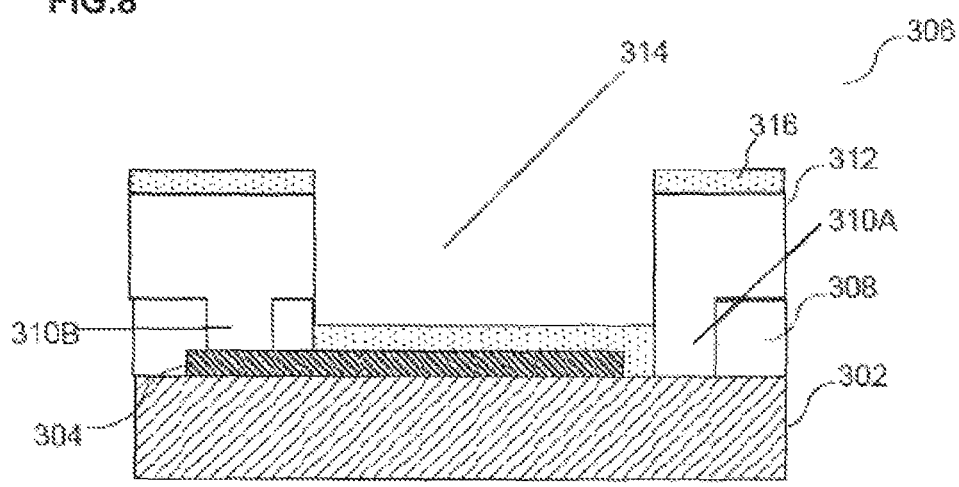
FIG. 8 shows a schematic illustration of a component in the method in accordance with various embodiments.

The steps described with reference to FIGS. 6, 7 and 8 are then carried out instead of the steps described in FIGS. 3D, 3E and 3F.

FIG. 6 shows a cross-sectional view (306) of the embodiment of the optoelectronic component during the method for producing the optoelectronic component. The second mask structure 312 is applied as a coating, that is to say in a liquid state, above the substrate 302 and/or the first electrode 304 and the first mask structure 308 and is subsequently cured and/or dried above the substrate 302. The second mask structure 312 is applied as a whole-area coating above the first electrode 304 and the first mask structure 308. The structurings 310A, 310B of the first mask structure 308 are filled with the material of the second mask structure 312 since the latter is applied in a liquid state and flows into the structurings 310A, 310B.

FIG. 7 shows a cross-sectional view (306) of the embodiment of the optoelectronic component during the method for producing the optoelectronic component. In particular, in the case of the optoelectronic component according to FIG. 6, the second structuring region 314 is formed in a manner corresponding to the step described with reference to FIG. 3E, specifically in the first mask structure 308 and in the second mask structure 312, such that the first electrode 304 is exposed in the second structuring region 314.

FIG. 8 shows a cross-sectional view (306) of the embodiment of the optoelectronic component during the method for producing the optoelectronic component. In particular, the organic functional layer structure 316 is formed above the first electrode 304 and/or above the substrate 302 and above the second mask structure 312. In particular, the organic functional layer structure 316 is formed in the second structuring region 314.

Afterward, in a manner corresponding to the steps described with reference to FIGS. 3G, 3H, 3I, the first and/or the second mask structure 308, 312 are/is removed and the second electrode 318 is formed.

The above-described method in which at least one of the mask structures 308, 312 is applied as a coating in a liquid state and is subsequently cured or dried can alternatively be carried out as a single-mask process. In the single-mask process, for example, just a single one of the two mask structures 308, 312 can be formed and used for forming the optoelectronic component. As an alternative thereto, although two or more mask structures 308, 312 can be formed and used, one of the mask structures 308, 312 is always removed first before the other of the mask structures 308, 312 is formed. As an alternative thereto, although two or more mask structures 308, 312 can be formed, they are not utilized and/or used simultaneously or in interaction.

As described, the printed film masks, that is to say the mask structures 308, 312, can be applied on the substrate 302 before the beginning of the coating process in which the organic functional layer structure 316 is formed. Here in the case of the double-mask layer stack, in part different regions are exposed in the lower, first mask film, that is to say the first mask structure 308, than in the upper, second mask film, that is to say the second mask structure 312. In other words, different regions can be exposed in the first structure region 310 than in the second structure region 314. This allows the coating of different regions in the two individual coating steps in which the organic functional layer structure 316 and the second electrode 318 are formed.

The coating(s) can be formed for example by a printing method, for example by screen printing, inkjet printing, or by blade coating. After application, the coatings, in particular the material of the coatings, can be crosslinked for example by energy input, in particular by UV exposure. The material is preferably selected such that it forms a slight crosslinking with the material on which it is applied. The material is preferably selected such that in the crosslinked state it inherently has a particularly high degree of crosslinking. The material of the coating(s) and of the corresponding mask structure 308, 312 may include or consist of, for example, a plastic, for example acrylate, silicone and/or rubber. By way of example, the material can be a UV-crosslinkable highly viscous silicone.

If a plurality of the mask structures 308, 312 are formed in the form of coatings one above another, then separating layers can optionally be applied therebetween or the materials of the coatings can optionally be chosen such that the two mask structures 308, 312 do not crosslink with one another. As a result, the mask structures 308, 312 can subsequently be removed independently of one another. By way of example, the material of the lower coating can be chosen such that, after being crosslinked once, it does not form further crosslinkings, for example with the coating applied thereabove.

The coatings and the mask structures 308, 312 formed therefrom, in particular the printed film masks, can be formed with open structure regions 310, 314 during application by a structured printing process, through which structure regions the substrate 302, the first electrode 304 or, in the case of the second mask structure 312, the first mask structure 308 can be coated afterward. This is advantageous compared with a conventional method in which the open regions have to be formed directly in the initially unstructured mask film, whereby the mask film is structured, particularly if laser ablation is used therefor, which tends toward generation of particles, as a result of which subsequent process steps such as thin-film deposition or component encapsulation can be disadvantageously influenced.

In the method, after the first coating step, that is to say the process of forming the organic functional layer structure 316, only the upper printed film mask, that is to say the second mask structure 312, is removed for example by stripping away (this can be carried out in line in the coating process tool), which replaces the mask change in a conventional process. This makes it possible to avoid a situation in which the substrate 302, after the first coating step, has to be fetched from the coating installation and provided with the second film mask, as a result of which the degradation, contamination and/or damage of the first deposited material, in particular of the first organic functional layer structure 316, can be avoided or at least kept small. Stripping away the upper film mask in line in the process can be carried out faster, in principle, than changing conventional metallic shadow masks, as a result of which process time can be saved and the cycle rate can be increased.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method for producing an optoelectronic component, comprising:
   forming a first electrode on a substrate;
   arranging a first mask structure on or above the substrate, wherein the first mask structure comprises a first structuring region comprising an opening and/or a region prepared for forming an opening;
   arranging a second mask structure on or above the first mask structure;
   forming a second structuring region in the first mask structure and in the second mask structure in such a way that at least one part of the first structuring region in the first mask structure is formed outside the second structuring region in the first mask structure;
   forming an organic functional layer structure above the first electrode and/or the substrate and in the second structuring region;
   removing the second mask structure and, if the first structuring region has the region prepared for forming the opening, forming the opening in the prepared region;
   forming a second electrode above the organic functional layer structure and/or above the substrate in the first structuring region, after removing the second mask structure or, respectively, after forming the opening in the prepared region; and
   removing the first mask structure;
   wherein the first and/or the second mask structure are applied as a coating in a liquid state above the substrate and are subsequently hardened and/or dried above the substrate.

2. The method as claimed in claim 1,
   wherein the first and/or the second mask structure are/is removed mechanically.

3. The method as claimed in claim 1,
   wherein the first structuring region and/or the second structuring region are/is formed in such a way that by the first structuring region and/or the second structuring region information is represented in the optically active region, preferably a pictogram, an ideogram and/or lettering; a look through hole, a window, a see through opening.

4. The method as claimed in claim 1,
   wherein forming the first structuring region and/or the second structuring region comprises forming at least one of the following structurings in the first mask structure and/or the second mask structure: a hole, a predetermined separating location, a ring structure.

5. The method as claimed in claim 1,
   wherein the first structuring region is formed in such a way that it has a lower adhesion with regard to the substrate, a higher adhesion with regard to the second mask structure and/or a different cohesion than the first mask structure outside the first structuring region.

6. The method as claimed in claim 1,
   wherein the second structuring region is formed in such a way that the second structuring region has a different adhesion with regard to the first mask structure, a different adhesion with regard to a further mask structure on the second mask structure and/or a different cohesion than the second mask structure outside the second structuring region.

7. The method as claimed in claim 1,
   wherein the first mask structure and/or the second mask structure comprise(s) a lug, wherein the lug is formed in such a way that the first mask structure and/or the second mask structure are/is removable by a tensile force on the lug.

8. The method as claimed in claim 1, furthermore comprising:
arranging a third mask structure, wherein the third mask structure is applied on or above the first mask structure after the second mask structure has been at least partly removed, and/or wherein the third mask structure is applied on or above the second mask structure.

9. The method as claimed in claim 1,
wherein the second mask structure comprises a structuring region and/or a prepared region before the process of arranging on or above the first mask structure.

10. The method as claimed in claim 9,
wherein the structuring region and/or the prepared region, after the process of arranging the second mask structure, is formed as second structuring region, as structure region of the second structuring region or as third structuring region.

* * * * *

UNITED STATES PATENT AND TRADEMARK OFFICE
CERTIFICATE OF CORRECTION

| | | |
|---|---|---|
| PATENT NO. | : 9,685,638 B2 | Page 1 of 1 |
| APPLICATION NO. | : 14/917297 | |
| DATED | : June 20, 2017 | |
| INVENTOR(S) | : Arne Fleissner et al. | |

It is certified that error appears in the above-identified patent and that said Letters Patent is hereby corrected as shown below:

In the Specification

Column 21, Line 43: Please delete "$WO^x$, $VO^x$" and insert:
--$WO_x$, $VO_x$--

Signed and Sealed this
Twelfth Day of September, 2017

Joseph Matal
*Performing the Functions and Duties of the*
*Under Secretary of Commerce for Intellectual Property and*
*Director of the United States Patent and Trademark Office*